United States Patent
Negishi et al.

(10) Patent No.: US 8,435,829 B2
(45) Date of Patent: May 7, 2013

(54) METHOD FOR PRODUCING A LIGHT-EMITTING ELEMENT

(75) Inventors: Eisuke Negishi, Tokyo (JP); Jiro Yamada, Kanagawa (JP); Mitsuhiro Kashiwabara, Kanagawa (JP); Hirofumi Nakamura, Kanagawa (JP); Seonghee Noh, Kanagawa (JP)

(73) Assignee: Sony Corporation, Tokyo (JP)

( * ) Notice: Subject to any disclaimer, the term of this patent is extended or adjusted under 35 U.S.C. 154(b) by 0 days.

(21) Appl. No.: 13/561,923

(22) Filed: Jul. 30, 2012

(65) Prior Publication Data

US 2012/0295016 A1      Nov. 22, 2012

Related U.S. Application Data

(62) Division of application No. 12/954,129, filed on Nov. 24, 2010, now Pat. No. 8,334,530.

(30) Foreign Application Priority Data

Dec. 1, 2009   (JP) .................. 2009-273101

(51) Int. Cl.
    *H01L 51/40*          (2006.01)

(52) U.S. Cl.
    USPC .............. 438/99; 438/679; 257/E51.018

(58) Field of Classification Search .......... 438/69, 438/82, 99, 676, 679; 257/E25.028, E33.001, 257/E51.018
See application file for complete search history.

(56) References Cited

U.S. PATENT DOCUMENTS

| 7,005,196 B1 | 2/2006 | Carter et al. |
| 7,102,282 B1 | 9/2006 | Yamada et al. |
| 7,994,706 B2 * | 8/2011 | Choi et al. ............ 313/504 |

FOREIGN PATENT DOCUMENTS

| JP | 2001-035667 | 2/2001 |
| JP | 2005-209647 | 8/2005 |
| JP | 2006-338916 | 12/2006 |
| WO | 01/39554 | 5/2001 |

* cited by examiner

*Primary Examiner* — Quoc Hoang
(74) *Attorney, Agent, or Firm* — K&L Gates LLP

(57) ABSTRACT

A method of producing a light-emitting element is provided. The method includes forming a first half-transmitting/reflecting film and a second half-transmitting/reflecting film sequentially on an organic layer by physical vapor deposition.

12 Claims, 18 Drawing Sheets

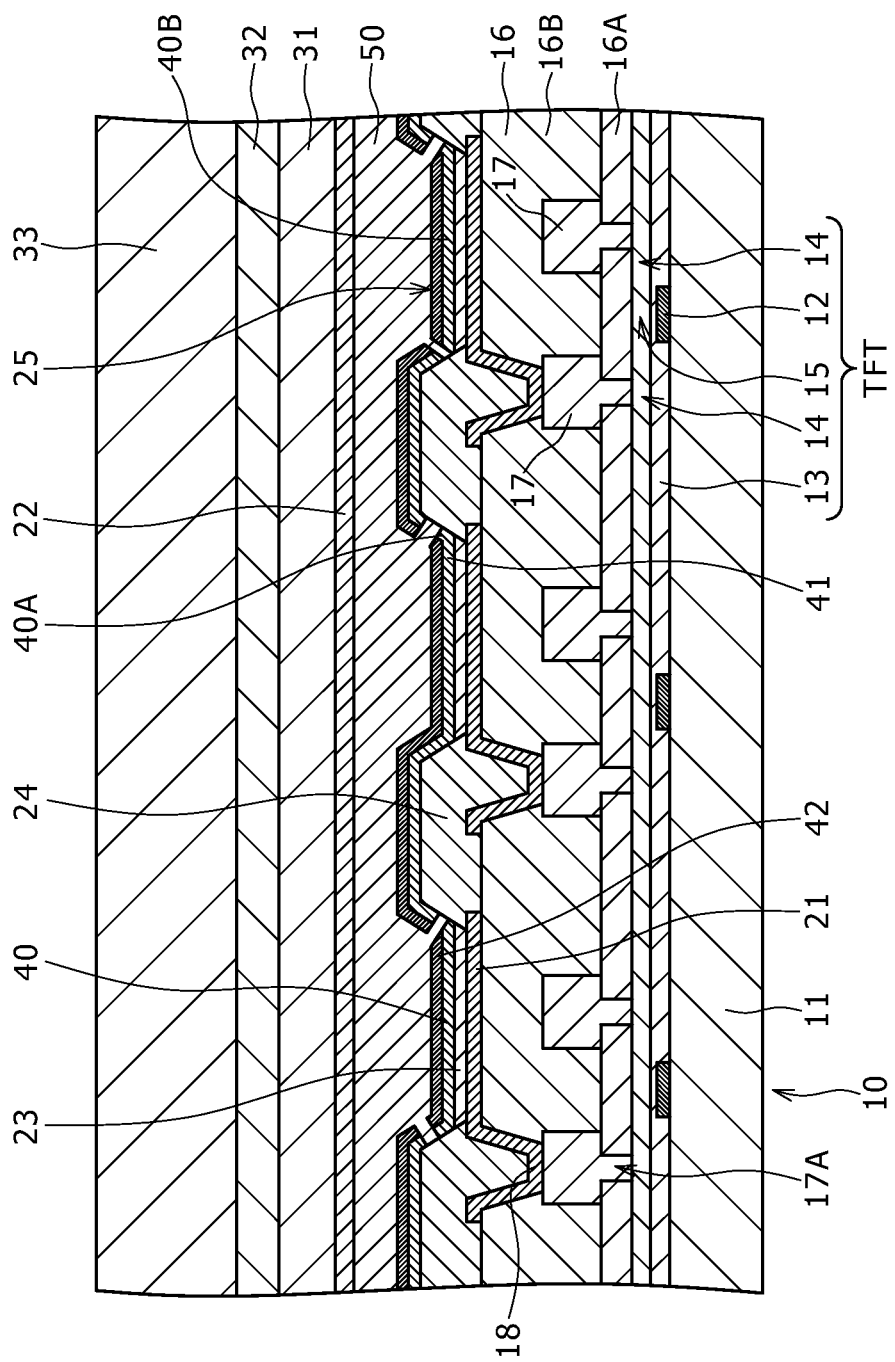

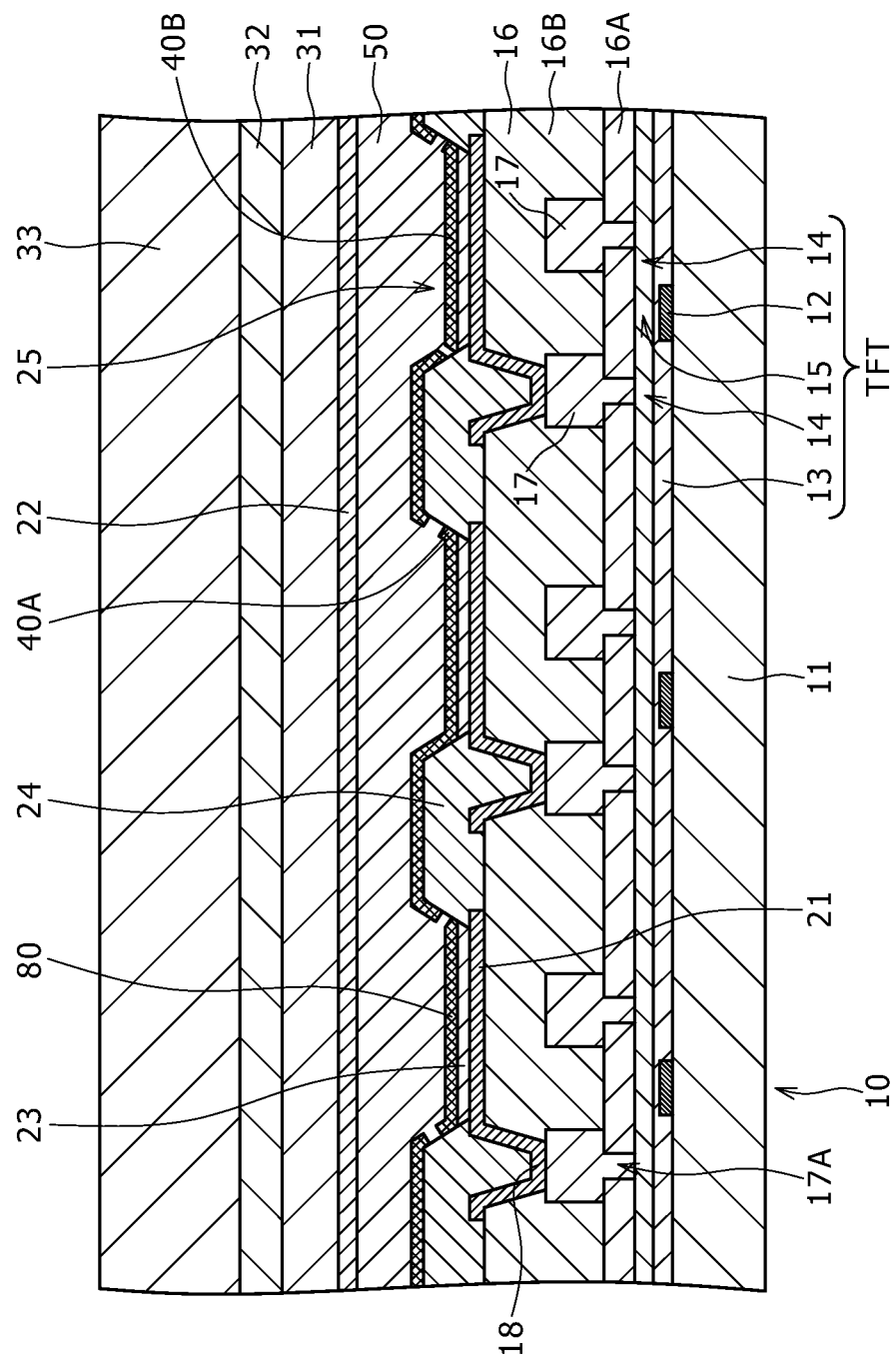

METHOD FOR PRODUCING A LIGHT-EMITTING ELEMENT

CROSS REFERENCES TO RELATED APPLICATIONS

The present application is a divisional of U.S. application Ser. No. 12/954,129, filed on Nov. 24, 2010, and which claims priority to Japanese Patent Application JP 2009-273101 filed on Dec. 1, 2009, the entire contents of which is hereby incorporated by reference.

BACKGROUND

The present disclosure relates to a light-emitting element and a method for production thereof More particularly, the present disclosure relates to an organic electroluminescence element and a method for production thereof The organic electroluminescence display device, which employs the organic electroluminescence element, has recently been attracting keen attention on account of its potential for replacing liquid crystal display devices. (Electroluminescence will occasionally be abbreviated as "EL" hereinafter.) The organic EL display device is of self-luminous type and is characterized by low power consumption. Moreover, it is expected to rapidly respond to high-speed video signals for high-definition display. Therefore, great efforts are being directed to its development and commercialization.

An organic EL element is usually composed of a first electrode, an organic layer (which has a light-emitting layer made of organic light-emitting material), and a second electrode, which are sequentially arranged in a laminate structure. Attempts are being made to incorporate the organic EL element with a resonator structure or to optimize the thickness of each layer as a constituent of the organic layers, thereby controlling the light that is generated in the light-emitting layer, in anticipation of improvement in color purity (of emitting light) and light emitting efficiency. (See PCT Patent Publication No. WO01/39554 pamphlet (hereinafter referred to as Patent Document 1), for instance.)

It is desirable to keep resonance as weak as possible or to keep the organic layer as thin as possible because the intensity of resonance or the thickness of the organic layer makes chromaticity and brightness much dependent on the viewing angle. In other words, the increased viewing angle results in a considerable shift of the peak wavelength in the spectrum of light emitted from the organic EL display device or a great decrease in the intensity of light. (See Patent Document 1.) However, the disadvantage of making the organic layer thinner is that the organic layer is not covered completely if there exist particles (foreign matter) and projections on the first electrode, as schematically shown in FIG. 18, and this incomplete covering would result in short circuits between the first electrode and the second electrode. In the case of organic EL display device of active matrix type, such short circuits result in missing pixels to aggravate its display quality. In the case of organic EL display device of passive matrix type, too, such short circuits result in missing lines. Such missing pixels or lines are a serious problem particular in the case of large-sized organic EL display device, which requires vigorous viewing angle characteristics and low tolerances for defects per unit area.

So far, many attempts have been made to reduce short circuits between the first electrode and the second electrode. For example, Japanese Patent Laid-open No. 2002-035667 (hereinafter referred to as Patent Document 2) discloses an organic EL display device of bottom emission type in which a high-resistance layer is inserted between the anode electrode and the organic film. Japanese Patent Laid-open No. 2006-338916 (hereinafter referred to as Patent Document 3) discloses an organic EL display device of top emission type in which the anode electrode is doubled and the anode electrode close to the organic layer is a high-resistance layer. Japanese Patent Laid-open No. 2005-209647 (hereinafter referred to as Patent Document 4) discloses an organic EL display device of bottom emission type in which the cathode electrode is doubled and the anode electrode close to the organic layer is a high-resistance layer.

SUMMARY

The above-mentioned problems, however, are not solved by the technology (as disclosed in Patent Documents 1 to 4) for insertion of a high-resistance layer between the anode and the cathode if it is combined with the resonator structure. In other words, the high-resistance film should be sufficiently thick in order for it to completely cover particles (foreign matter) and projections, thereby avoiding display defects certainly. Unfortunately, making the high-resistance film thick ends up with an increasing dependence on the viewing angle.

In addition, decreasing the driving voltage for the organic EL element is very important from the standpoint of overall power saving for the organic EL display device.

It is desirable to provide a light-emitting element and a method for production thereof, the light-emitting element being so constructed as to be exempt from short-circuiting between the first electrode and the second electrode even though there exist particles (foreign matter) and projections on the first electrode, and also being operable with a low driving voltage.

According to a first embodiment, there is provided a light-emitting element which includes:
 (A) a first electrode,
 (B) an organic layer with a light-emitting layer made of organic light-emitting material,
 (C) a half-transmitting/reflecting film,
 (D) a resistance layer, and
 (E) a second electrode,
 which are sequentially laminated on top of the other,
 wherein the first electrode reflects light from the light-emitting layer,
 the second electrode transmits light from the light-emitting layer,
 the half-transmitting/reflecting film includes a first half-transmitting/reflecting film and a second half-transmitting/reflecting film which are laminated in this order from a side of the organic layer, and
 the half-transmitting/reflecting film on the organic layer has an average thickness of 1 nm to 6 nm.

According to a second embodiment, there is provided a light-emitting element which includes:
 (A) a first electrode,
 (B) an organic layer with a light-emitting layer made of organic light-emitting material,
 (C) a resistance layer, and
 (D) a second electrode,
 which are sequentially laminated on top of the other,
 wherein the first electrode reflects light from the light-emitting layer,
 the second electrode transmits light from the light-emitting layer, and
 a mixture layer including a material constituting the uppermost layer of the organic layer, a material constituting the lowermost layer of the resistance layer, and a metal is formed between the organic layer and the resistance layer.

According to a third embodiment, there is provided a method for production of a light-emitting element having:
(A) a first electrode,
(B) an organic layer with a light-emitting layer made of organic light-emitting material,
(C) a resistance layer, and
(D) a second electrode,
which are sequentially laminated on top of the other, the first electrode reflecting light from the light-emitting layer, and
the second electrode transmitting light from the light-emitting layer. The method includes the step of forming a first half-transmitting/reflecting film and a second half-transmitting/reflecting film sequentially on the organic layer by physical vapor deposition (PVD).

The light-emitting element according to the first embodiment is characterized in that the half-transmitting/reflecting film is composed of a first half-transmitting/reflecting film and a second half-transmitting/reflecting film laminated one over another. The light-emitting element according to the second embodiment is characterized in that the organic layer and the resistance layer hold a mixture layer between them. According to the third embodiment, the method for production of the light-emitting element is characterized in that the first half-transmitting/reflecting film and the second half-transmitting/reflecting film are formed sequentially by physical vapor deposition. The resulting half-transmitting/reflecting film and mixture layer provide good electrical contact between the resistance layer and the organic layer and permit the carrier to be introduced into the organic layer under good conditions. The resulting light-emitting element has a reduced driving voltage and an extended life.

Moreover, the light-emitting element is characterized in that the organic layer is held between the first electrode and the half-transmitting/reflecting film or between the first electrode and the mixture layer so that a resonator structure is formed. (The half-transmitting/reflecting film and the mixture layer may be collectively referred to as "half-transmitting/reflecting film etc." hereinafter.) This structure improves emission efficiency and makes brightness and chromaticity by far less dependent on the viewing angle. On the organic layer is formed the resistance layer, and on the resistance layer is formed the second electrode. This structure permits the second electrode to properly apply a voltage to the organic layer even though there exist particles (foreign matter) or projections or steps on the first electrode and hence the organic layer does not cover the first electrode completely. Moreover, the resistance layer protects the first and second electrodes from short-circuiting and prevents the first electrode from coming into contact with the half-transmitting/reflecting film etc.

The light-transmitting element according to the present embodiments is as reliable as the light-emitting element or organic EL element of related-art type because the half-transmitting/reflecting film etc. are formed from Mg—Ag, which has been used in the related-art organic EL element, and the second electrode is formed separately from the half-transmitting/reflecting film etc.

Additional features and advantages are described herein, and will be apparent from the following Detailed Description and the figures.

BRIEF DESCRIPTION OF THE FIGURES

FIG. 1 is a schematic partly sectional view showing the organic electroluminescence display device according to Example 1;

FIG. 15 is a schematic partly sectional view showing the organic electroluminescence display device according to Example 7;

DETAILED DESCRIPTION

Figure 2A:
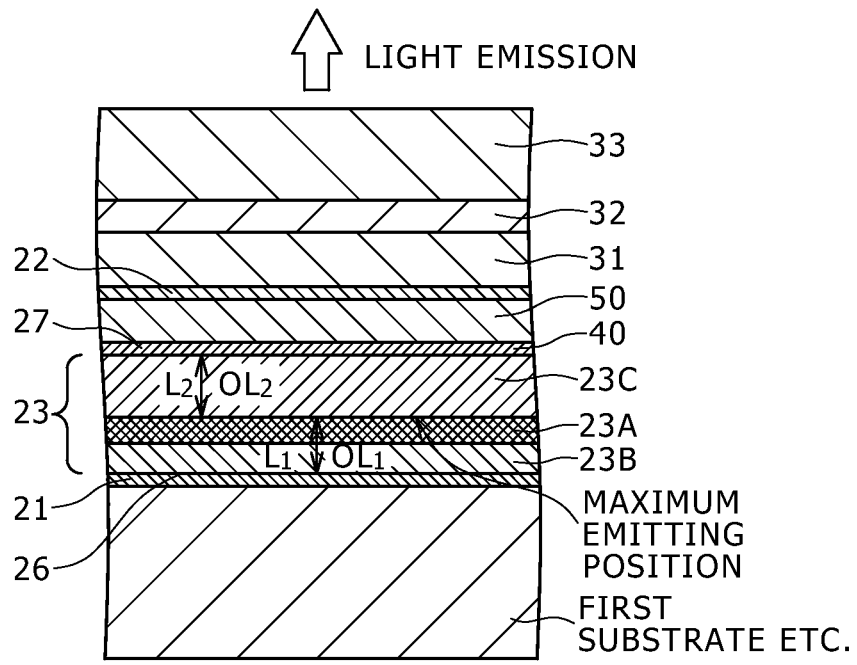
FIGS. 2A and 2B are schematic diagrams illustrating the organic layer etc. in the organic electroluminescence display device according to Example 1.

The embodiments will be described in more detail with reference to the examples that follow, together with the accompanying drawings. The description of the embodiments and examples is in the following order.

1. A general description of the light-emitting element pertaining to the first and second embodiments and the method for production of the light-emitting element according to another embodiment
2. Example 1 (The light-emitting element pertaining to the first embodiment)
3. Example 2 (Modification of Example 1)
4. Example 3 (Another modification of Example 1)
5. Example 4 (Further another modification of Example 1)
6. Example 5 (Further another modification of Example 1)
7. Example 6 (Modification of Example 5)
8. Example 7 (Light-emitting element pertaining to the second embodiment, and others)

(A general description of the light-emitting element pertaining to the first and second embodiments and the method for production of the light-emitting element according to an embodiment)

The method for production of the light-emitting element according to an embodiment depends on the conditions under which PVD is carried out to form the first half-transmitting/reflecting film and the second half-transmitting/reflecting film, or to form the resistance layer. In other words, it may give rise to the light-emitting element pertaining to the first embodiment or the second embodiment depending on the conditions for PVD. A desirable method for PVD is vacuum vapor deposition or long throw magnetron sputtering, which employs low-energy particles for film forming PVD in this manner is desirable because it protects the organic layer from being damaged and it forms a discontinuous part (mentioned later). Any damage to the organic layer may result in non-emitting pixels due to leak current. The light-emitting element pertaining to the second embodiment is constructed such that a mixture layer including a material constituting the uppermost part of the organic layer, a material constituting the lowermost part of the resistance layer, and a metal is formed between the organic layer and the resistance layer. This mixture layer can be obtained by sequentially forming the first and second half-transmitting/reflecting layers on the organic layer by PVD and then forming the resistance layer by PVD.

The light-emitting element (or the method for production thereof) pertaining to the first embodiment is characterized in that the first half-transmitting/reflecting film is formed from calcium (Ca), aluminum (Al), barium (Ba), or cesium (Cs) and the second half-transmitting/reflecting film is formed from alkali metal (or alkaline earth metal) and silver (Ag) [for example, magnesium (Mg) and silver (Ag)] or from magnesium (Mg) and calcium (Ca) or from aluminum (Al) and silver (Ag). The preferred combination of the materials that constitute the first and second half-transmitting/reflecting films is shown below.

Calcium and magnesium combined with silver
Aluminum and magnesium combined with silver
Barium and magnesium combined with silver
Cesium and magnesium combined with silver
Lithium and magnesium combined with silver Both the first and second half-transmitting/reflecting films should have a thickness of 1 nm to 5 nm, for instance.

In the case where the second half-transmitting/reflecting film is formed from magnesium and silver, their ratio by volume should be Mg:Ag=from 5:1 to 30:1, for instance. Also, in the case where the second half-transmitting/reflecting film is formed from magnesium and calcium, their ratio by volume should be Mg:Ca=from 2:1 to 10:1, for instance.

In dealing with the light-emitting element pertaining to the first embodiment or the method for production of the light-emitting element according to the embodiment, the term "half-transmitting/reflecting film composed of the first half-transmitting/reflecting film and the second half-transmitting/reflecting film laminated one over another" is construed usually as "film." However, sometimes it may be an inhomogeneous mixture of the uppermost part of the organic layer, the half-transmitting/reflecting film, and the lowermost part of the resistance layer, or it may be a mixture of the uppermost part of the organic layer, magnesium (constituting the half-transmitting/reflecting film), and the resistance layer, with silver particles being distributed in them.

On the other hand, the light-emitting element pertaining to the second embodiment may contain the metal exemplified by alkaline earth metal, such as calcium (Ca), magnesium (Mg), and barium (Ba). The metal may also include silver (Ag), aluminum (Al), and cesium (Cs).

The following modification may be made to the light-emitting element pertaining to the first or second preferred embodiment and the method for production of the light-emitting element according to the embodiment. The resistance layer is made of a material having a resistivity of $1 \times 10^2$ to $1 \times 10^6$ $\Omega \cdot m$ (or $1 \times 10^4$ to $1 \times 10^8$ $\Omega \cdot cm$), preferably $1 \times 10^4$ to $1 \times 10^5$ $\Omega \cdot m$ (or $1 \times 10^6$ to $1 \times 10^7$ $\Omega \cdot cm$), and the resistance layer above the organic layer has a thickness of 0.1 to 2 μm, preferably 0.3 to 1 μm. The resistance layer should preferably be made of an oxide semiconductor, such as niobium oxide ($Nb_2O_5$), titanium oxide ($TiO_2$), molybdenum oxide ($MoO_2$, $MoO_3$), tantalum oxide ($Ta_2O_5$), hafnium oxide (HfO), IGZO, a mixture of niobium oxide and titanium oxide, a mixture of titanium oxide and zinc oxide (ZnO), a mixture of silicon oxide ($SiO_2$) and tin oxide ($SnO_2$), and a combination thereof. Incidentally, the material constituting the resistance layer should have an adequate resistivity which is determined from the voltage drop that occurs in the resistance layer when the light-emitting element is driven or the organic EL element is driven. A typical value of the voltage drop is 0.05 to 1.0 volt.

The following modification may also be made to the light-emitting element pertaining to the first or second preferred embodiment and the method for production of the light-emitting element according to the embodiment. The resistance layer is composed of a first resistance layer and a second resistance layer laminated one over another in the order from the organic layer. The second resistance layer has a higher resistivity than the first resistance layer. Moreover, the resistance layer is composed of a first resistance layer, a second resistance layer, and a third resistance layer laminated on top of the other in the order from the organic layer. The second resistance layer has a higher resistivity than the first resistance layer and the third resistance layer. The first and third resistance layers may be formed from any of zinc oxide, tin oxide, niobium oxide, titanium oxide, molybdenum oxide, tantalum oxide, a mixture of niobium oxide and titanium oxide, a mixture of titanium oxide and zinc oxide, and a mixture of silicon oxide and tin oxide. These layers are formed while the oxygen partial pressure is kept low. The second resistance layer may be formed from any of niobium oxide, titanium oxide, molybdenum oxide, tantalum oxide, a mixture of niobium oxide and titanium oxide, a mixture of titanium oxide and zinc oxide, and a mixture of silicon oxide and tin oxide.

The first, second, and third resistance layers should have resistivity $R_1$ (Ω·m), $R_2$ (Ω·m), and $R_3$ (Ω·m), respectively, such that:

$$1\times 10^{-3} \leq R_1/R_2 \leq 1\times 10^{-1}$$

$$1\times 10^{-3} \leq R_3/R_2 < 1\times 10^{-1}$$

The resistance layer in multilayer structure provides good contact between the half-transmitting/reflecting layer and the resistance layer, thereby reducing the voltage drop across the resistance layer and reducing the driving voltage.

Incidentally, in the case where the resistance layer is composed of the first resistance layer and the second resistance layer in laminate structure or in the case where the resistance layer is composed of the first resistance layer, the second resistance layer, and the third resistance layer in laminate structure, the mixture layer may contain the material that constitutes the first resistance layer.

The following modification may also be made to the light-emitting element pertaining to the first or second preferred embodiment and the method for production of the light-emitting element according to the embodiment. The resistance layer is composed of at least the first resistance layer and the second resistance layer in laminate structure, and the first resistance layer is made of a material having a refractive index of $n_1$, the second resistance layer is made of a material having a refractive index of $n_2$, and the uppermost part of the organic layer is made of a material having a refractive index of $n_0$, such that:

$-0.6 \leq n_0-n_1 \leq -0.4$
$0.4 \leq n_1-n_2 < 0.9$
(if importance is attached to efficiency)
$-0.2 \leq n_0-n_1 \leq 0.2$
$0.2 \leq n_1-n_2 \leq 0.4$
(if importance is attached to viewing angle)

The following modification may also be made to the light-emitting element pertaining to the first or second preferred embodiment and the method for production of the light-emitting element according to the embodiment. The light generated by the emitting layer is made to resonate between the first interface (between the first electrode and the organic layer) and the second interface [or the third or fourth interface mentioned later] (between the half-transmitting/reflecting film and the organic layer), so that a portion of the light is emitted from the second electrode. In this case, the first interface should be away from the maximum emitting position of the light-emitting layer by an optical distance of $OL_1$ and the second interface (or the third or fourth interface mentioned later) should be away from the maximum emitting position of the light-emitting layer by an optical distance of $OL_2$ such that the formulas (1-1) and (1-2) below are satisfied. Alternatively, the first interface should be away from the second interface (or the third or fourth interface mentioned later) by an optical distance OL, the first interface and the second interface (or the third or fourth interface mentioned later) reflect the light generated by the emitting layer in such a way that the total phase shift is Φ radians [where $-2\Pi < \Phi \leq 0$], and the emitting layer generates light whose spectrum has the maximum peak wavelength λ such that:

$$0.7 \leq \{(2\times OL)/\lambda + \Phi/(2\Pi)\} \leq 1.3$$

or $$-0.3 \leq \{(2\times OL)/\lambda + \Phi/(2\Pi)\} \leq 0.3$$

The conditions for interference or resonance of light which are determined by the first interface and the second interface (or the like) make brightness and chromaticity very little dependent on the viewing angle.

$$0.7\{-\Phi_1/(2\Pi)+m_1\} \leq 2\times OL_1/\lambda \leq 1.2\{-\Phi_1/(2\Pi)+m_1\} \quad (1\text{-}1)$$

$$0.7\{-\Phi_2/(2\Pi)+m_2\} \leq 2\times OL_2/\lambda \leq 1.2\{-\Phi_2/(2\Pi)+m_2\} \quad (1\text{-}2)$$

where,
λ: maximum peak wavelength of spectrum of light generated by the emitting layer,
$\Phi_1$: amount (in radians) of the phase shift of reflected light that occurs at the first interface
[where $-2\Pi < \Phi_1 \leq 0$],
$\Phi_2$: amount (in radians) of the phase shift of reflected light that occurs at the second interface (or the third or fourth interface mentioned later)
[where $-2\Pi < \Phi_2 \leq 0$], and
the value of $(m_1, m_2)$ is (0, 0), (1, 0), or (0, 1).

As mentioned above, the interface between the first electrode and the organic layer is referred to as "the first interface." The interface between the half-transmitting/reflecting film etc. and the organic layer is referred to as "the second interface." The interface between the half-transmitting/reflecting film etc. and the resistance layer is referred to as "the third interface." The interface between the first resistance layer and the second resistance layer is referred to as "the fourth interface." The light-emitting element pertaining to the first embodiment is designed such that the light generated by the emitting layer is made to resonate between the first interface and the second interface; however, there exists an instance in which the light generated by the emitting layer mostly passes through the half-transmitting/reflecting film etc. when the half-transmitting/reflecting film etc. is so thin that they have a high average transmittance. In this case, the light generated by the emitting layer is made to resonate between the first interface and the third interface. In the case where the resistance layer is of multilayer structure, the light generated by the emitting layer is made to resonate between the first interface and the fourth interface, between the first interface and the third interface, or between the first interface and the fourth interface.

The following modification may be made to the light-emitting element pertaining to the first or second preferred embodiment or the light emitting element obtained by the method for production of the light-emitting element according to the embodiment. (These light-emitting elements may be collectively referred to as "light-emitting element etc." hereinafter.)

The light generated by the emitting layer is made to resonate between the first interface and the second interface (or the third or fourth interface) in such a way that a portion of the light is made to emerge from the second electrode. The light generated by the emitting layer has the spectrum whose maximum peak wavelength is 600 nm to 650 nm. The organic layer on the first electrode has a thickness of $1.1\times 10^{-7}$ m to $1.6\times 10^{-7}$ m. (The resulting light-emitting element emits red light, and it is referred to as the red light emitting element or the red light emitting organic EL element.)

The light-emitting element etc. may be modified such that the light generated by the emitting layer is made to resonate between the first interface and the second interface (or the third or fourth interface) so that a portion of the light is made to emerge from the second electrode. The light generated by the emitting layer has the spectrum whose maximum peak wavelength is 500 nm to 550 nm. The organic layer on the first electrode has a thickness of $9\times 10^{-8}$ m to $1.3\times 10^{-7}$ m. (The resulting light-emitting element emits green light, and it is referred to as the green light emitting element or the green light emitting organic EL element.)

The light-emitting element etc. may be modified such that the light generated by the emitting layer is made to resonate between the first interface and the second interface (or the third or fourth interface) so that a portion of the light is made to emerge from the second electrode. The light generated by the emitting layer has the spectrum whose maximum peak wavelength is 430 nm to 480 nm. The organic layer on the first electrode has a thickness of $6 \times 10^{-8}$ m to $1.1 \times 10^{-7}$ m. (The resulting light-emitting element emits blue light, and it is referred to as the blue light emitting element or the blue light emitting organic EL element.)

The foregoing light-emitting element pertaining to the first preferred embodiment may be used as constituents of the organic electroluminescence display device (organic EL display device) which includes a plurality of light-emitting elements (or organic electroluminescence elements or organic EL elements) sequentially laminated on top of the other, each being composed of:
  (a) a first electrode,
  (b) an insulating layer having an opening which permits the first electrode to expose itself through its bottom,
  (c) an organic layer having a light-emitting layer made of an organic light-emitting material, the organic layer extending from above that part of the first electrode, which exposes itself at the bottom of the opening, to that part of the insulating layer which surrounds the opening,
  (d) a half-transmitting/reflecting film (composed of a first half-transmitting/reflecting film and a second half-transmitting/reflecting film in laminate structure sequentially arranged from the organic layer) which is formed at least on the organic layer,
  (e) a resistance layer that covers the half-transmitting/reflecting film, and
  (f) a second electrode which is formed on the resistance layer,
  the first electrode reflecting light from the light-emitting layer,
  the second electrode transmitting light from the light-emitting layer,
  the half-transmitting/reflecting film on the organic layer having an average film thickness of 1 nm to 6 nm, and
  that part of the half-transmitting/reflecting film which is on the insulating film being at least partly discontinuous.

The foregoing light-emitting element pertaining to the second preferred embodiment may be used as constituents of the organic electroluminescence display device (organic EL display device) which includes a plurality of light-emitting elements (or organic electroluminescence elements or organic EL elements) sequentially laminated on top of the other, each being composed of:
  (a) a first electrode,
  (b) an insulating layer having an opening which permits the first electrode to expose itself through its bottom,
  (c) an organic layer having a light-emitting layer made of an organic light-emitting material, the organic layer extending from above that part of the first electrode, which exposes itself at the bottom of the opening, to that part of the insulating layer which surrounds the opening,
  (d) a resistance layer covering the organic layer, and
  (e) a second electrode which is formed on the resistance layer,
  a mixture layer including a material constituting the uppermost part of the organic layer, a material constituting the lowermost part of the resistance layer, and a metal being formed between the organic layer and the resistance layer,
  the first electrode reflecting light from the light-emitting layer,
  the second electrode transmitting light from the light-emitting layer, and
  that part of the mixture layer which is on the insulating layer being at least partly discontinuous.

The organic EL display device mentioned above is characterized in that that part of the half-transmitting/reflecting film which is on the insulating film is at least partly discontinuous. To be more specific, that part of the half-transmitting/reflecting film which is on the insulating film may be partly continuous or not continuous with that part of the half-transmitting/reflecting film which is on the organic layer. There are some organic EL elements in which that part of the half-transmitting/reflecting film which is on the insulating film is partly continuous with that part of the half-transmitting/reflecting film which is on the organic film. There are other organic EL elements than mentioned above in which that part of the half-transmitting/reflecting film which is on the insulating film is not continuous with that part of the half-transmitting/reflecting film which is on the organic film.

The organic EL display device may vary in the pattern of arrangement of the organic EL elements. The pattern may be classified into stripe, diagonal, delta, and rectangle.

The following modification may also be made to the light-emitting element pertaining to the first or second preferred embodiment and the method for production of the light-emitting element according to the embodiment. In the case where there exist foreign matter or projections on the first electrode, the half-transmitting/reflecting film is not formed in the neighborhood of the foreign matter or projections but the resistance layer exists between that part of the half-transmitting/reflecting film which is at the periphery of the foreign matter and projections and that part of the first electrode which is under the foreign matter or at the base of the projections. The foreign matter (particles) are liable to attach themselves onto the first electrode while the first electrode is being formed or during transportation. By contrast, the projections are liable to occur while the first electrode is being formed.

The following modification may also be made to the light-emitting element pertaining to the first or second preferred embodiment and the method for production of the light-emitting element according to the embodiment. The first electrode has an average reflectance no lower than 50%, preferably no lower than 80%. The half-transmitting/reflecting film has an average transmittance of 50 to 97%, preferably 60 to 97%.

As a material (light reflecting material) for the first electrode (light reflecting electrode) in the light-emitting element according to an embodiment, if the first electrode is to function as the anode, an adequate material is selected from platinum (Pt), gold (Au), silver (Ag), chromium (Cr), tungsten (W), nickel (Ni), copper (Cu), iron (Fe), cobalt (Co), and tantalum (Ta), which have a high work function, and alloys thereof, such as Ag—Pd—Cu alloy containing 0.3 to 1 wt % palladium (Pd) and 0.3 to 1 wt % copper (Cu), with the remainder being silver, and Al—Nd alloy. In the case where the first electrode is formed from aluminum (Al) or aluminum alloy, which has a low work function and which is an electrically conductive material having a high reflectance, it is necessary to provide an adequate hole injecting layer (thereby improving hole injecting performance) so that the first electrode functions as the anode. The first electrode should have a thickness of 0.1 to 1 μm, for instance. Alternatively, the first electrode may be formed in laminate structure composed of a dielectric multilayer film or a light reflecting film of aluminum (Al) having a high reflectance and a layer of transparent conductive material superior in hole injecting performance, such as indium-tin oxide (ITO) and indium-zinc oxide (IZO). On the other hand, if the first electrode is to function as the cathode, it should preferably be formed from a conductive material which has a low work function and a high reflectance. However, the first electrode may be used as the cathode if the conductive material having a high reflectance (as the material for the first electrode) is provided with an adequate electron injecting layer for improvement in electron injecting performance.

As the material for the second electrode in the light-emitting element according to an embodiment, if the second electrode is to function as the cathode, an adequate material is selected from metals or alloys which transmit the emitted light and have a low work function so that they permit efficient electron injection into the organic layer. Their examples include magnesium-silver, aluminum, silver, calcium, and strontium. It may also be formed from the so-called transparent electrode material, such as ITO and IZO, which is provided with an adequate electron injecting layer for improvement in electron injection performance. The second electrode should have a thickness of $2 \times 10^{-9}$ m to $5 \times 10^{-8}$ m, preferably $3 \times 10^{-9}$ m to $2 \times 10^{-8}$ m, more preferably $5 \times 10^{-9}$ m to $1 \times 10^{-8}$ m. Alternatively, the second electrode may be provided with a bus electrode (auxiliary electrode) made of a low-resistance material, so that the second electrode as a whole has a low resistance. If the second electrode is to function as an anode, it should preferably be formed from a material which is transparent to the emitted light and has a high value of work function.

The first and second electrodes may be formed by any of the following methods. Electron beam vapor deposition, hot filament vapor deposition, vacuum vapor deposition, sputtering, chemical vapor deposition (CVD), combination of ion plating and etching, screen printing, ink jet printing, metal mask printing, electric plating, electroless plating, liftoff, laser abrasion, and sol-gel method. The printing and plating methods can directly form the first and second electrodes having the desired pattern. In the case where the organic layer is formed first and then the first or second electrode is formed, vacuum deposition or MOCVD is desirable because it causes less damage to the organic layer on account of its low particle energy. The steps from the formation of the organic layer to the formation of the electrode should be carried out in an environment isolated from the atmospheric air so as to protect the organic layer from deterioration by moisture in the atmospheric air. The second electrode may or may not be electrically connected to the half-transmitting/reflecting film etc.

The resistance layer, the first resistance layer, the second resistance layer, and the third resistance layer should preferably be formed by sputtering, CVD, or ion plating which is superior in covering performance.

The first electrode and the half-transmitting/reflecting film absorb a portion of the incident light and reflect the remainder of the incident light, thereby resulting in phase shift in the reflected light. The amount of phase shift $\Phi_1$ and $\Phi_2$ can be calculated from the real part and the imaginary part of the complex index of refraction (measured by ellipsometry) of the material constituting the first electrode and the half-transmitting/reflecting film. (See "Principles of Optics," Max Born and Emil Wolf, 1974 (Pergamon Press), for instance.) Incidentally, ellipsometry can also be used to measure the refractive index of the organic layer, the second electrode, and other layers.

The organic layer has the emitting layer formed from organic light-emitting material. To be more specific, it may be composed of a hole transporting layer, a light-emitting layer, and an electron transporting layer in laminate structure; it may be composed of a hole transporting layer and a light-emitting layer, which functions also as an electron transporting layer, in laminate structure; or it may be composed of a hole injection layer, a hole transporting layer, a light-emitting layer, an electron transporting layer, and an electron injection layer in laminate structure. If a term "tandem unit" is used to collectively denote an electron transporting layer, a light-emitting layer, a hole transporting layer, and a hole injection layer, then the organic layer may be composed of a first tandem unit, a connection layer, and a second tandem unit which are arranged on top of the other. (This is a two-tier tandem structure.) Moreover, the organic layer may have three or more tandem units. (This is a three-tier tandem structure.) In these cases, the color of emitted light can be changed into red, green, and blue by means of each tandem unit, so that the organic layer emits white color as a whole.

The organic layer may be formed by physical vapor deposition (PVD) (such as vacuum vapor deposition), printing (such as screen printing and ink jet printing), laser transfer, and coating. (Laser transfer consists of forming a laser absorption layer and an organic layer (in laminate structure) on a transfer substrate, irradiating the laminated layers with laser, thereby separating the organic layer from the laser absorption layer, and transferring the thus separated organic layer.) Vacuum deposition may be carried out in such a way that the material for deposition passes through an opening in the metal mask to form the organic layer.

According to the embodiment, the hole transporting layer (hole supply layer) and the electron transporting layer (electron supply layer) should preferably have almost the same thickness. Alternatively, the latter may be slightly thicker than the former. In this case, sufficient electrons can be supplied to the emitting layer for efficient light emission at a low driving voltage. In other words, the light-emitting element according to an embodiment is constructed such that the hole supply layer (thinner than the electron transporting layer) is arranged between the electrode (or anode) and the light-emitting layer so that more holes can be supplied. This realizes a balanced supply of holes and electrons, with a sufficient carrier supply, thereby contributing to a high emitting efficiency. Owing to the balanced carriers, the light-emitting element according to an embodiment has an extended life.

According to the present embodiments, a plurality of light-emitting elements or organic EL elements are formed on or above the first substrate. The first substrate may be a substrate made of any of high-strain point glass, soda glass ($Na_2O.CaO.SiO_2$), borosilicate glass ($Na_2O.B_2O_3.SiO_2$), forsterite ($2MgO.SiO_2$), and lead glass ($N_2O.PbO.SiO_2$). It may also include a variety of glass substrates, quartz substrates, and silicon substrates, each having an insulating film formed thereon. It may also include plastics substrate (in the form of plate or flexible sheet or film) made of polymeric material, such as polymethyl methacrylate (PMMA), polyvinyl alcohol (PVA), polyvinyl phenol (PVP), polyether sulfone (PES), polyimide, polycarbonate, and polyethylene terephthalate (PET). The foregoing materials may also be used for the second substrate. The first and second substrates may be formed from identical or different materials. However, in the case of the organic EL display device of bottom emitting type mentioned later, the first substrate is required to be transparent to the light emerging from the light-emitting element.

In the organic EL display device, the first electrode is arranged on the interlayer insulating layer, which covers the driver for the light-emitting element which is formed on the first substrate. The driver for the light-emitting element is composed of one or more thin film transistors (TFT). The TFT is electrically connected to the first electrode through the contact plug formed in the interlayer insulating layer. The interlayer insulating layer is formed from any of $SiO_2$-based material (such as $SiO_2$, BPSG, PSG, BSG, AsSG, PbSG, SiON, SOG (spin on glass), low-melting glass, and glass paste), and SiN-based material, insulating resin (such as polyimide). They may be used alone or in combination with one another. The interlayer insulating layer may be formed by any known process, such as CVD, coating, sputtering, and printing. In the case of the organic EL display device of bottom-emitting type mentioned later, the interlayer insulating layer should be formed from a material transparent to light from the light-emitting element and the driver for the light-emitting element should be formed in such a way that it does not shade light from the light-emitting element. The insulating layer on the interlayer insulating layer is required to be flat, resistant to deterioration by moisture from the organic layer, and suitable for high brightness. Therefore, it should be formed from an insulating material with a low level of moisture absorption, such as polyimide resin. If the second electrode is provided with a bus electrode (auxiliary electrode), the bus electrode should preferably be positioned such that it does not cast its shadow on the insulating layer.

The organic EL display device may have a second substrate positioned above the second electrode. The organic EL display device of this structure will occasionally be referred to as "organic EL display device of top emission type" hereinafter. On the other hand, the organic EL display device may have a first substrate positioned under the second electrode. The organic EL display device of this structure will occasionally be referred to as "organic EL display device of bottom emission type" hereinafter. The organic EL display device of top emission type may be constructed such that the second electrode and the second substrate hold between them a protective film and an adhesion layer (sealing layer) which are arranged from the second electrode. The protective film should preferably be formed from any material which is transparent to light from the light-emitting layer and which is compact and water-impervious. Typical examples of such material include amorphous silicon ($\alpha$-Si), amorphous silicon carbide ($\alpha$-SiC), amorphous silicon nitride ($\alpha$-$Si_{1-x}N_x$), amorphous silicon oxide ($\alpha$-$Si_{1-y}O_y$), amorphous carbon ($\alpha$-C), amorphous silicon oxide nitride ($\alpha$-SiON), and $Al_2O_3$. The adhesion layer (seal layer) should be formed from any thermosetting adhesive (such as acrylic adhesive, epoxy adhesive, urethane adhesive, silicone adhesive, and cyanoacrylate adhesive) or UV curable adhesive. Incidentally, the organic EL display device of bottom emission type may also be constructed in such a way that the second substrate is positioned above the first electrode and the first electrode and the second substrate hold between them the protective film and adhesion layer (mentioned above) arranged from the first electrode.

The organic layer should preferably be provided above it with an insulating or conductive protective film to isolate it from moisture, as mentioned above. The protective film may be formed by vacuum vapor deposition (with low particle energy) or CVD which has little effect on the underlying layer. In addition, the protective film should preferably be formed at normal temperature to protect the organic layer from deterioration which lowers brightness or under any condition which causes minimum stress to the protective film to prevent its peeling. Moreover, the protective film should preferably be formed in such a way that the previously formed electrode is not exposed to the atmospheric air. In this way, the organic layer is protected against deterioration by moisture and oxygen in the atmospheric air. Furthermore, the protective film should preferably be formed from any material that transmits more than 80% of light emitted from the organic layer. Examples of such material include inorganic amorphous insulating materials which have been listed above. They are free from grains and form a good protective film with a low level of water permeability. The protective film may also be formed from a transparent conductive material such as ITO and IZO so that it has electrical conductivity.

In the case where the organic EL display device is intended for use as an organic EL color display device, each organic EL element for the organic EL display device constitutes a sub-pixel. One pixel is composed three sub-pixels, each emitting red light (with a red light emitting element), green light (with a green light emitting element), and blue light (with a blue light emitting element). Therefore, if the organic EL display device is composed of as many organic EL elements as N×M, the number of pixels is (N×M)/3. The organic EL display device may also be used as the backlight for liquid crystal display devices or as the illuminator with a plane light source.

The first or second substrate that transmits light from the light-emitting element may be provided with a color filter or shading film formed thereon according to need.

Each resistance layer constituting the red, green, and blue light-emitting elements may differ from one another in the value of resistance ($R_R$, $R_G$, and $R_B$) as follows according to circumstances.

$R_B > R_G$
$R_B > R_R$

The foregoing is realized by constituting the red, green, and blue light-emitting elements with respective resistance layers differing in thickness or material or content of substance contributing to conductivity.

The organic EL display device may be provided in its peripheral region with a lead-out electrode for connection of the second electrode to an external circuit. The peripheral region denotes that region resembling a picture frame surrounding the display region which occupies the large central area of the organic EL display device. The lead-out electrode is attached to the first or second substrate. It may be formed from film of high-melting metal such as titanium (Ti), molybdenum (Mo), tungsten (W), and tantalum (Ta). Connection between the second electrode and the lead-out electrode may be accomplished by forming an extended part of the second electrode on the lead-out electrode. The lead-out electrode may be formed in the same way as mentioned above for the first and second electrodes.

EXAMPLE 1

Figure 2B:
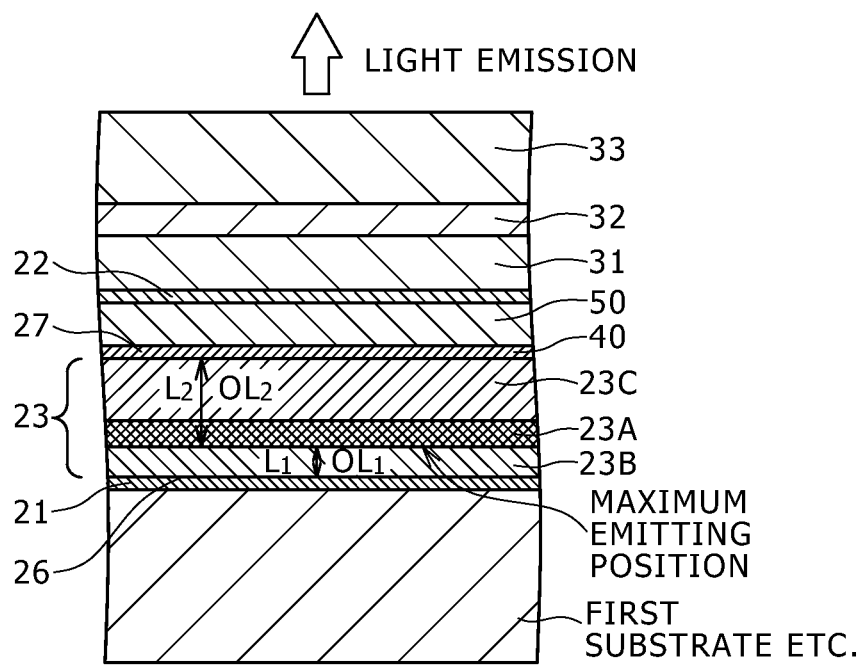

Example 1 relates to the light-emitting element pertaining to the first embodiment and the method for production of the light-emitting element according to the embodiment. FIG. 1 is a schematic partly sectional view showing the organic EL display device with the light-emitting element of Example 1. FIGS. 2A and 2B are schematic diagrams illustrating the organic layer etc. in the light emitting element of Example 1.

The organic EL display device of Example 1 or Examples 2 to 7 mentioned later is that of active matrix type capable of color display. It is that of top-emitting type, which emits light through the second electrode and the second substrate. The organic EL display device of Example 1 or Examples 2 to 7 mentioned later has a plurality of light-emitting elements (specifically organic EL elements) 10. The number of light-emitting elements is N×M=2880×540, for instance. Incidentally, one light-emitting element (or organic EL element) 10 constitutes one sub-pixel. Consequently, the organic EL display device has (N×M)/3 pixels. Here, one pixel is composed of three sub-pixels, each emitting red light, green light, and blue light.

The light-emitting element (or organic EL element) of Example 1 is composed of the following components which are sequentially laminated on top of the other.

(A) the first electrode 21,
(B) the organic layer 23 having the light-emitting layer 23A of organic light-emitting material,
(C) the half-transmitting/reflecting film,
(D) the resistance layer 50, and
(E) the second electrode 22.

The first electrode 21 reflects light from the light-emitting layer 23A. The second electrode 22 transmits light from the light-emitting layer 23A. The half-transmitting/reflecting film includes the first half-transmitting/reflecting film 41 and the second half-transmitting/reflecting film 42 which are laminated in this order from a side of the organic layer 23. The half-transmitting/reflecting film on the organic layer 23 has an average thickness of 1 to 6 nm.

The organic EL display device of Example 1 has a plurality of organic EL elements each having the following components.

(a) the first electrode 21,
(b) the insulating layer 24 which has the opening 25, at the bottom of which the first electrode 21 exposes itself,
(c) the organic layer 23 which has the light-emitting layer 23A of organic light-emitting material and which extends from that part of the first electrode 21 which exposes itself at the bottom of the opening 25 to that part of the insulating layer 24 which surrounds the opening 25,
(d) the half-transmitting/reflecting film formed at least on the organic layer 23 (which includes the first half-transmitting/reflecting film 41 and the second half-transmitting/reflecting film 42 which are laminated in this order from a side of the organic layer 23),
(e) the resistance layer 50 covering the half-transmitting/reflecting film, and
(f) the second electrode 22 formed on the resistance layer 50.

The first electrode 21 reflects light from the light-emitting layer 23A. The second electrode 22 transmits light from the light-emitting layer 23A. The half-transmitting/reflecting film on the organic layer 23 has an average thickness of 1 to 6 nm. That part of the half-transmitting/reflecting film which is on the insulating layer 24 is at least partly discontinuous.

The half-transmitting/reflecting film which is composed of the first half-transmitting/reflecting film 41 and the second half-transmitting/reflecting film 42 laminated one over the other is shown as if it is a single layer in FIGS. 2A and 2B, FIGS. 7A and 7B, FIGS. 12A and 12B, and FIGS. 13A and 13B. The first half-transmitting/reflecting film 41 and the second half-transmitting/reflecting film 42 will be occasionally referred to collectively as "half-transmitting/reflecting film 40" hereinafter.

In Example 1 or in Examples 2 to 5 and 7 mentioned later, the first electrode 21 functions as the anode and the second electrode 22 functions as the cathode. To be more specific, the first electrode 21 has a thickness of 0.2 μm and is made of a transparent reflecting material such as Al—Nd alloy. The second electrode 22 has a thickness of 0.1 μm and is made of a transparent conductive material such as ITO and IZO. The first half-transmitting/reflecting film 41 has a thickness of 2 nm and is made of calcium. The second half-transmitting/reflecting film 42 has a thickness of 3 nm and is made of a conductive material containing magnesium (Mg), such as Mg—Ag alloy composed of Mg and Ag in a volume ratio of 10:1. The first electrode 21 patterned in a desired shape is formed by vacuum deposition and etching in combination. On the other hand, the second electrode 22 and the half-transmitting/reflecting film 40 are formed by vacuum deposition with a low level of particle energy. The second electrode 22 and the half-transmitting/reflecting film 40 are not patterned but remain in the form of a single sheet. Incidentally, between the organic layer 23 and the half-transmitting/reflecting film 40 is formed an electron injection layer of LiF (not shown) which is 0.3 nm thick. Table 2 below shows the refractive index of the first electrode 21 and the second electrode 22, the reflectance of the first electrode 21, and the transmittance of the half-transmitting/reflecting film 40. Incidentally, measurements were carried out at a wavelength of 530 nm.

In Example 1, or in Examples 2 to 7 mentioned later, the insulating layer 24 is formed from polyimide resin, which is an insulating material with a low level of moisture absorption, so that it has good flatness and protects the organic layer 23 from deterioration by moisture, thereby keeping high brightness. Although the organic layer 23 is composed of the hole transporting layer and the light-emitting layer (which functions also as the electron-transporting layer), it may be represented by a single layer in the drawings.

In Example 1, or in Examples 2 to 7 mentioned later, the first electrode 21 as one constituent of the organic EL element is arranged on the interlayer insulating layer 16 (to be specific, the upper interlayer insulating layer 16B) formed from $SiO_2$ by CVD. This interlayer insulating layer 16 covers the driver of the organic EL element which is formed on the first substrate 11 of soda glass. The driver of the organic EL element is composed of a plurality of TFTs. Each TFT is electrically connected to the first electrode 21 through the contact plug 18 formed in the interlayer insulating layer (to be concrete, the upper interlayer insulating layer 16B), the wiring 17, and the contact plug 17A. Incidentally, the drawing shows one TFT for each driver of the organic EL element. The TFT is composed of the gate electrode 12 (which is formed on the first substrate 11), the gate insulating film 13 (which is formed on the first substrate 11 and the gate electrode 12), the source-drain region 14 (which is arranged in the semiconductor layer formed on the gate insulating film 13), and the channel-forming region 15 (which corresponds to that part of the semiconductor layer which is above the gate electrode 12). Incidentally, although the TFT shown in the drawing is that of bottom gate type, it may be that of gate top type. The gate electrode 12 of the TFT is connected to the scanning circuit (not shown).

In Example 1, or in Examples 2 to 7 mentioned later, the second electrode 22 is covered with the protective film 31, which is an insulating film of amorphous silicon ($\alpha$-$Si_{1-x}N_x$) formed by plasma CVD and which is intended for protection of the organic layer 23 from moisture. The second substrate 33 of soda glass is arranged on the protective film 31. The protective film 31 and the second substrate 33 are joined together by the adhesion layer 32 of acrylic adhesive. Table 2 shows the refractive index of the protective film 31 and the adhesion layer 32. Measurements were carried out at a wavelength of 530 nm.

The detailed structure of the light-emitting element of Example 1 is summarized in Table 1 below.

TABLE 1

| | |
|---|---|
| Second substrate 33 | Soda glass |
| Adhesion layer 32 | Acrylic adhesive |
| Protective film 31 | SiN$_x$ layer (5 m thick) |
| Second electrode (cathode) 22 | ITO layer (0.1 m thick) |
| Resistance layer 50 | Nb$_2$O$_5$ layer (0.5 m thick) |
| Half-transmitting/reflecting film | |
| Second half-transmitting/reflecting film 42 | Mg—Ag film (3 nm thick) |
| First half-transmitting/reflecting film 41 | Ca film (2 nm thick) |
| Electron injection layer | LiF layer (0.3 nm thick) |
| Organic layer 23 | Mentioned later |
| First electrode (anode) 21 | Al—Nd layer (0.2 m thick) |
| Interlayer insulating layer 16 | SiO$_2$ layer |
| TFT | Driver for organic EL element |
| First substrate 11 | Soda glass |

TABLE 2

| | |
|---|---|
| Refractive index of first electrode 21 | Real part: 0.755<br>Imaginary part: 5.466 |
| Refractive index of half-transmitting/reflecting film 40 | Real part: 0.617<br>Imaginary part: 3.904 |
| Refractive index of second electrode 22 | Real part: 1.814<br>Imaginary part: 0 |
| Refractive index of resistance layer 50 | Real part: 2.285<br>Imaginary part: 0 |
| Refractive index of protective film 31 | Real part: 1.87<br>Imaginary part: 0 |
| Refractive index of adhesion layer 32 | Real part: 1.53<br>Imaginary part: 0 |
| Reflectance of first electrode 21 | 85% |
| Transmittance of half-transmitting/reflecting film 40 | 60% |
| Reflectance of second electrode 22 | 2% |

Although that part 40A of the half-transmitting/reflecting film which is on the insulating layer 24 is at least partly discontinuous, that part 40A of the half-transmitting/reflecting film which is on the insulating layer 24 is partly connected to that part 40B of the half-transmitting/reflecting film which is on the organic layer 23. In some organic EL elements, that part 40A of the half-transmitting/reflecting film 40 which is on the insulating layer 24 is not connected to that part 40B of the half-transmitting/reflecting film 40 which is on the organic layer 23. Alternatively, in some organic EL elements, that part 40A of the half-transmitting/reflecting film 40 which is on the insulating layer 24 is partly connected to that part 40B of the half-transmitting/reflecting film 40 which is on the organic layer 23, and in another organic EL elements, that part 40A of the half-transmitting/reflecting film 40 which is on the insulating layer 24 is not connected to that part 40B of the half-transmitting/reflecting film 40 which is on the organic layer 23. Incidentally, that part 40A of the half-transmitting/reflecting film 40 which is on the insulating layer 24 has a smaller average film thickness than that part 40B of the half-transmitting/reflecting film 40 which is on the organic layer 23. Therefore, that part 40B of the half-transmitting/reflecting film 40 which is on the organic layer 23 should have an average film thickness of 1 to 6 nm so that that part 40A of the half-transmitting/reflecting film 40 which is on the insulating layer 24 is made to be discontinuous certainly.

Light emitted from the light-emitting layer 23A is made to resonate between the first interface 26 (which is between the first electrode 21 and the organic layer 23) and the second interface 27 (which is between the half-transmitting/reflecting film 40 and the organic layer 23), and a portion of the light is made to emerge through the half-transmitting/reflecting film 40 and the second electrode 22.

In Example 1, or in Examples 2 to 6 mentioned later, the light-emitting element has the following parameters which satisfy the formulas (1-1) and (1-2) below.

Distance L$_1$ and optical distance OL$_1$ between the first interface 26 (which is between the first electrode 11 and the organic layer 23) and the maximum light-emitting position of the light-emitting layer 23A.

Distance L$_2$ and optical distance OL$_2$ between the second interface 27 (which is between the half-transmitting/reflecting film 40 and the organic layer 23) and the maximum light-emitting position of the light-emitting layer 23A. (See FIGS. 2A and 2B.)

$$0.7\{-\Phi_1/(2\Pi)+m_1\} \leq 2 \times OL_1/\lambda \leq 1.2\{-\Phi_1/(2\Pi)+m_1\} \quad (1\text{-}1)$$

$$0.7\{-\Phi_2/(2\Pi)+m_2\} \leq 2 \times OL_2/\lambda \leq 1.2\{-\Phi_2/(2\Pi)+m_2\} \quad (1\text{-}2)$$

where,

λ,: maximum peak wavelength of spectrum of light generated by the emitting layer 23A, $\Phi_1$: amount (in radians) of the phase shift of reflected light that occurs at the first interface 26
[where $-2\Pi < \Phi_1 \leq 0$], $\Phi_2$: amount (in radians) of the phase shift of reflected light that occurs at the second interface 27
[where $-2\Pi < \Phi_2 \leq 0$], and the value of (m$_1$, m$_2$) is (0, 0) in Example 1 or Examples 2 to 6 mentioned later.

In Example 1, or in Examples 2 to 6 mentioned later, the light-emitting element has the following parameters which satisfy the formulas below.

Optical distance OL between the first interface 26 (between the first electrode 21 and the organic layer 23) and the second interface 27 (between the half-transmitting/reflecting film 40 and the organic layer 23).

The amount $\Phi$ (in radians) of the phase shift of reflected light that occurs when light generated by the light-emitting layer 23A is reflected by the first interface 26 and the second interface 27.

The maximum peak wavelength λ of the spectrum of light generated by the light-emitting layer 23A.

$$-0.3 \leq \{(2 \times OL)/\lambda + \Phi/(2\Pi)\} \leq 0.3$$

where, $-2\Pi < \Phi_1 \leq 0$.

In Example 1, or in Examples 2 to 7 mentioned later, each organic layer 23 is composed of a red emitting organic layer (in the red emitting organic EL element constituting the red emitting sub-pixel), a green emitting organic layer (in the green emitting organic EL element constituting the green emitting sub-pixel), and a blue emitting organic layer (in the blue emitting organic EL element constituting the blue emitting sub-pixel). A plurality of organic EL elements are arranged in a pattern of stripe, diagonal, delta, or rectangle.

The light-emitting element that functions as the red emitting organic EL element causes light from the emitting layer 23A to resonate between the first interface 26 and the second interface 27 so that a portion of the light emerges from the second electrode 22. Light from the emitting layer 23A has a spectrum whose maximum peak wavelength is 600 to 650 nm (typically 620 nm in Example 1 or Examples 2 to 7 mentioned later).

The organic layer 23 on the first electrode 21 has a thickness of $1.1 \times 10^{-7}$ to $1.6 \times 10^{-7}$ m (typically 140 nm in Example 1).

To be more specific, the red emitting organic layer is constructed as shown in Table 3 below. The maximum emission position is at the interface between the electron transporting layer 23C and the light-emitting layer 23A. (See FIG. 2A.) In Table 3 or Tables 4 and 5 mentioned later, the layers are arranged such that they become closer to the first electrode as they come down.

TABLE 3

| Material | | Film thickness |
|---|---|---|
| Electron transporting layer | Idemitsu Kosan: ET085 | 60 nm |
| Light-emitting layer | Idemitsu Kosan: RH001 + Toray: D125 (0.5% doped) | 50 nm |
| Hole transporting layer | Idemitsu Kosan: HT320 | 20 nm |
| Hole injection layer | LG Chemical: LGHIL | 10 nm |

Also, the light-emitting element that functions as the green emitting organic EL element causes light from the emitting layer 23A to resonate between the first interface 26 and the second interface 27 so that a portion of the light emerges from the second electrode 22. Light from the emitting layer 23A has a spectrum whose maximum peak wavelength is 500 to 550 nm (typically 530 nm in Example 1 or Examples 2 to 7 mentioned later).

The organic layer 23 on the first electrode 21 has a thickness of $9 \times 10^{-8}$ to $1.3 \times 10^{-7}$ m (typically 118 nm in Example 1).

To be more specific, the green emitting organic layer is constructed as shown in Table 4 below. The maximum emission position is at the interface between the hole transporting layer 23B and the light-emitting layer 23A. (See FIG. 2B.)

TABLE 4

| Material | | Film thickness |
|---|---|---|
| Electron transporting layer | Idemitsu Kosan: ETS085 | 30 nm |
| Light-emitting layer | Idemitsu Kosan: BH232 + GD206 (10% doped) | 30 nm |
| Hole transporting layer | Idemitsu Kosan: HT320 | 48 nm |
| Hole injection layer | LG Chemical: LGHIL | 10 nm |

Also, the light-emitting element that functions as the blue emitting organic EL element causes light from the emitting layer 23A to resonate between the first interface 26 and the second interface 27 so that a portion of the light emerges from the second electrode 22. Light from the emitting layer 23A has a spectrum whose maximum peak wavelength is 430 to 480 nm (typically 460 nm in Example 1 or Examples 2 to 7 mentioned later).

The organic layer 23 on the first electrode 21 has a thickness of $6 \times 10^{-8}$ to $1.1 \times 10^{-7}$ m (typically 88 nm in Example 1).

To be more specific, the blue emitting organic layer is constructed as shown in Table 5 below. The maximum emission position is at the interface between the hole transporting layer 23B and the light-emitting layer 23A. (See FIG. 2B.)

TABLE 5

| Material | | Film thickness |
|---|---|---|
| Electron transporting layer | Idemitsu Kosan: ET085 | 20 nm |
| Light-emitting layer | Idemitsu Kosan: BH232 + BD218 (10% doped) | 30 nm |
| Hole transporting layer | Idemitsu Kosan: HT320 | 28 nm |
| Hole injection layer | LG Chemical: LGHIL | 10 nm |

In Example 1 or in Examples 3 to 7 mentioned later, the resistance layer 50 is formed from niobium oxide ($Nb_2O_5$) having a resistivity of $1 \times 10^4$ Ω·m ($1 \times 10^6$ Ω·cm), and the resistance layer 50 above the organic layer 23 has a thickness of 0.5 μm. The resistance layer 50 specified above has a voltage drop shown below. The second electrode 22 and the resistance layer 50 have the following specifications.

[Second Electrode 22]
Electrical resistivity ($\rho_1$): $3.0 \times 10^{-4}$ Ω·cm
Film thickness ($d_1$): 0.1 μm
Current density in second electrode 22 ($J_1$): 10 mA/cm²

[Resistance Layer 50]
Electrical resistivity ($\rho_2$): $1.0 \times 10^4$ to $1.0 \times 10^6$ Ω·cm
Film thickness ($d_2$): 0.5 μm
Current density in second electrode 22 ($J_2$): 10 mA/cm²
Sheet resistance of second electrode 22=$(\rho_1/d_1)$=30Ω/□
Sheet resistance of resistance layer 50=$(\rho_2/d_2)$=$2 \times 10^8$ to $2 \times 10^{10}$ Ω/□
Voltage drop in the second electrode 22=$\rho_1 \times d_1 \times J_1$=$3.0 \times 10^{-11}$ V
Voltage drop in the resistance layer 50=$\rho_2 \times d_2 \times J_2$=5 mV to 500 mV As mentioned above, in the case where the resistance layer 50 is formed from $Nb_2O_5$, it is estimated that the voltage drop in the resistance layer 50 is approximately 0.5 V at most. This voltage drop is not so high as to cause problems with driving the organic EL element or the organic EL display device.

The organic layers each emitting red light, green light, and blue light have the values of λ, $L_1$, $OL_1$, $2OL_1/\lambda$, $L_2$, $OL_2$, $2OL_2/\lambda$, $n_{ave}$, $\{-2\Phi_1/(2\Pi)+m_1\}$, and $\{-2\Phi_2/(2\Pi)+m_2\}$ as shown in Table 6 below, provided that $m_1$=0 and $m_2$=0.

TABLE 6

| | Unit | Red emitting organic layer | Green emitting organic layer | Blue emitting organic layer |
|---|---|---|---|---|
| λ | nm | 620 | 530 | 460 |
| $L_1$ | nm | 80 | 58 | 38 |
| $OL_1$ | nm | 144 | 110 | 75.2 |
| $2OL_1/\lambda$ | | 0.465 | 0.416 | 0.327 |
| $L_2$ | nm | 60 | 60 | 50 |
| $OL_2$ | nm | 107 | 109 | 93.8 |
| $2OL_2/\lambda$ | | 0.345 | 0.410 | 0.408 |
| $n_{ave}$ | | 1.793 | 1.854 | 1.920 |
| $-\Phi_1/(2\Pi) + m_1$ | | 0.399 | 0.380 | 0.357 |
| $-\Phi_2/(2\Pi) + m_2$ | | 0.369 | 0.361 | 0.352 |

Figure 3A:
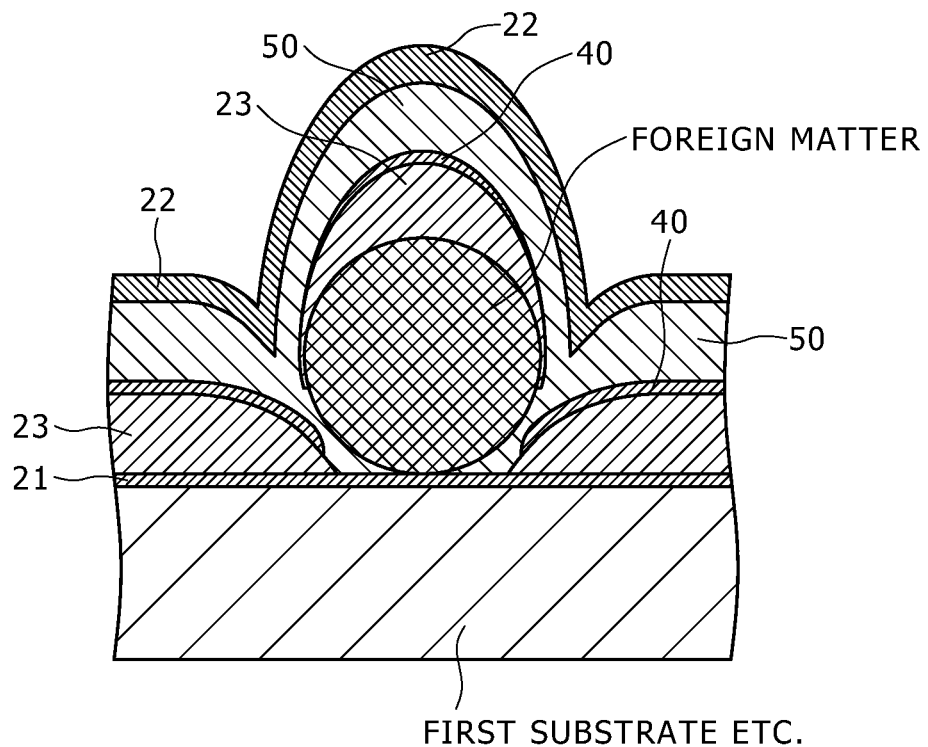
FIG. 3A is a schematic partly sectional view showing how the organic layer etc. are formed when there exist foreign matter on the first electrode in the organic electroluminescence display device according to Example 1.

It often occurs that foreign matter (particles) adhere to the first electrode 21 during its deposition and transportation. It also often occurs that projections grow from the first electrode 21 during its deposition. Moreover, steps occur while the organic layer 23 is being formed. Such foreign matter and projections result in incomplete covering on the organic layer 23 as schematically shown in FIG. 3A. Foreign matter, projections, and steps on the first electrode 21 lead to partial breakage around them in the half-transmitting/reflecting film 40, which is as thin as 1 to 6 nm, to be formed on the organic layer 23. Partial breakage means that the half-transmitting/reflecting film 40 is not formed in the neighborhood of foreign matter, projections, and steps. When the resistance layer 50 is formed under this condition, it comes to exist between that part of the first electrode 21 which is under foreign matter or projections and that part of the half-transmitting/reflecting film 40 which is in the neighborhood of foreign matter or projections.

Figure 4:
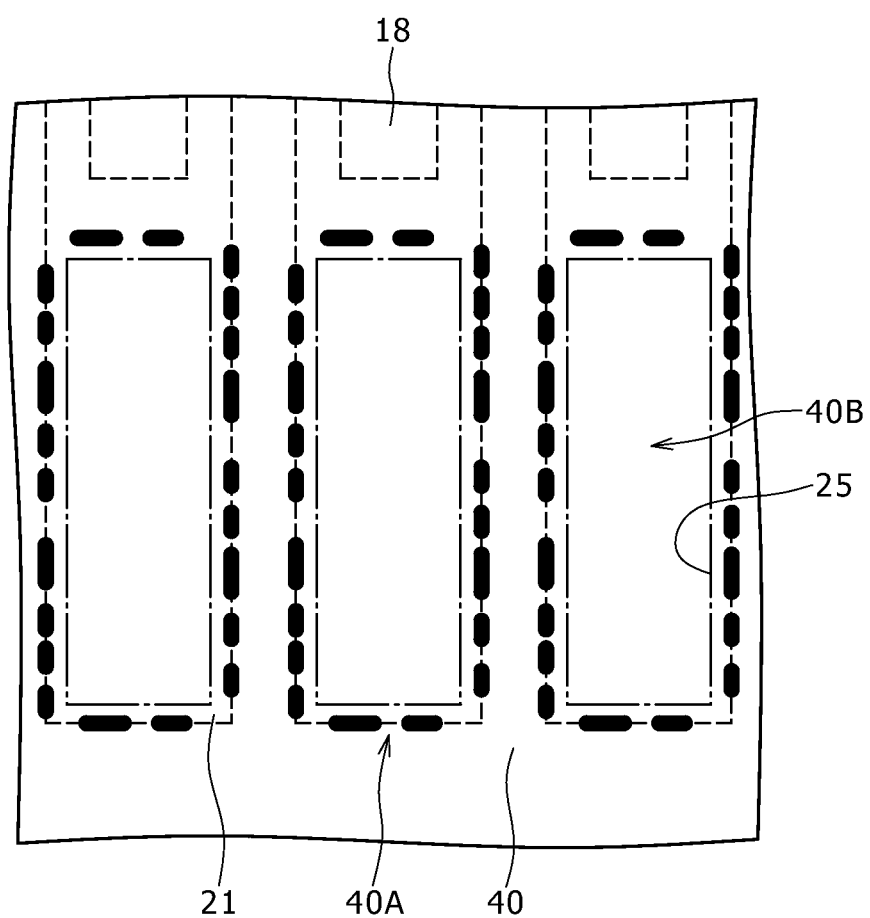
FIG. 4 is a schematic diagram illustrating the arrangement of the organic layer etc. in the organic electroluminescence display device according to Example 1.

As mentioned above, that part 40B of the half-transmitting/reflecting film 40 which is on the organic layer 23 has an average thickness of 1 to 6 nm. Consequently, that part 40A of the half-transmitting/reflecting film 40 which is on the insulating layer 24 becomes discontinuous. To be more specific, the organic layer 23 having the light-emitting layer 23A extends from above that part of the first electrode 21 which exposes itself at the bottom of the opening 25 to that part of the insulating layer 24 which surrounds the opening 25. The half-transmitting/reflecting film 40 also extends from above the organic layer 23 to that part of the insulating layer 24 which surrounds the opening 25. Here, that part of the insulating layer 24 which surrounds the opening 25 is inclined downward toward the opening 25. Therefore, that part 40A of the half-transmitting/reflecting film 40 which is above that part of the insulating layer 24 which surrounds the opening 25 is thinner than that part 40B of the half-transmitting/reflecting film 40 which is above the organic layer 23. Consequently, that part 40A of the half-transmitting/reflecting film 40 on that part of the insulating layer 24 that surrounds the opening is discontinuous. This is schematically shown in FIG. 4, in which black parts represent the discontinuous parts of the half-transmitting/reflecting film 40. In addition, the contact plug 18 and the first electrode 21 are represented by dotted lines, and the edge of the opening 25 is represented by a chain line. In FIG. 4, the discontinuity is shown by regular parts, in actuality, however, it is composed of irregular parts.

The first electrode 21 and the second electrode 22 hold between them the resistance layer 50, which prevents short-circuiting from occurring across them even though there exist foreign matter and projections when a voltage is applied across them to drive the light-emitting element. Moreover, the resistance layer 50 prevents the first electrode 21 from coming into contact with the half-transmitting/reflecting film 40. Incidentally, if contact should occur, they come to have an equal potential, inactivating the organic layer 23 for light emission.

In Example 1, or in Examples 2 to 6 mentioned later, the half-transmitting/reflecting film 40 is composed of the first half-transmitting/reflecting film 41 and the second half-transmitting/reflecting film 42 which are laminated one over another. It is formed by sequentially forming the first half-transmitting/reflecting film 41 and the second half-transmitting/reflecting film 42 on the organic layer 23 by PVD. The half-transmitting/reflecting film 40 formed in this manner provides good electrical contact between the resistance layer 50 and the organic layer 23 and injects carriers into the organic layer 23 in a desirable manner. It also reduces the driving voltage, thereby extending the life of the light-emitting element.

The organic EL display device of Example 1 was examined for change with time in the ratio of relative brightness. The results are graphically shown in FIG. 3B, in which the abscissa represents the length of time (in hours) for the organic EL display device to remain on, and the ordinate represents the relative brightness ratio. In Comparative Example 1, the organic EL display device was prepared in which the light-emitting element possesses only the second half-transmitting/reflecting film 42 (5 nm thick), with the first half-transmitting/reflecting film 41 not formed. If it is assumed that the organic EL display device of Comparative Example 1 has a relative brightness of $RL_0$ and the organic EL display device of Example 1 has a relative brightness of $RL_1$, then the ratio of relative brightness is represented by $RL_1/RL_0$. The relative brightness is represented by the brightness after a certain lapse of time divided by the initial brightness.

Figure 3B:
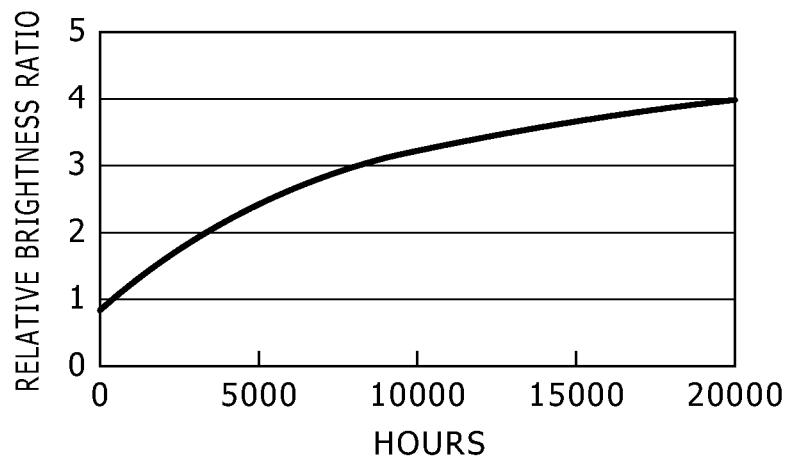
FIG. 3B is a graph showing the change with time in the relative brightness ratio in the organic electroluminescence display device according to Example 1 which has the half-transmitting/reflecting film of double-layer structure.

It is noted from FIG. 3B that the organic EL display device of Example 1 becomes larger in the ratio of relative brightness as time goes on than the organic EL display device of Comparative Example 1. In other words, the organic EL display device of Example 1, which has the half-transmitting/reflecting films 41 and 42 laminated one over another, suffers a less decrease in brightness from the initial brightness and has a longer life as compared with the organic EL display device of Comparative Example 1. Moreover, the organic EL display device of Example 1 was run with a driving voltage (at a current of 10 mA/cm$^2$) lower by 15% than that of the organic EL display device of Comparative Example 1.

The method for production of the organic EL display device of Example 1 will be outlined below with reference to FIGS. 5A and 5B, FIGS. 6A and 6B, and FIGS. 7A and 7B.

(Step-100)

The first step is to form TFT for each sub-pixel on the first substrate 11 by any known method. The TFT is composed of the gate electrode 12 (which is formed on the first substrate 11), the gate insulating film 13 (which is formed on the first substrate 11 and the gate electrode 12), the source-drain region 14 (which is arranged in the semiconductor layer formed on the gate insulating film 13), and the channel forming region 15 (which is in the source-drain region 14 and which corresponds to that part of the semiconductor layer which is above the gate electrode 12). Although the illustrated TFT is that of bottom gate type, that of top gate type is also acceptable. The gate electrode 12 of the TFT is connected to the scanning circuit (not shown). Then the first substrate 11 is coated with the lower interlayer insulating layer 16A of SiO$_2$ by CVD so that the TFT is covered. Finally, the lower interlayer insulating layer 16A undergoes etching by photolithography so that the opening 16' is formed therein. (See FIG. 5A.)

(Step-110)

The lower interlayer insulating layer 16A undergoes vacuum deposition and etching in combination to form the wiring 17 of aluminum. Incidentally, the wiring 17 is electrically connected to the source-drain region of the TFT through the contact plug 17A formed in the opening 16'. The wiring 17 is connected to the signal supply circuit (not shown). The entire surface is covered with the upper interlayer insulating layer 16B of SiO$_2$ by CVD. Then, the opening 18' is formed in the upper interlayer insulating layer 16B by photolithography and etching. (See FIG. 5B.)

(Step-120)

Figure 5A:
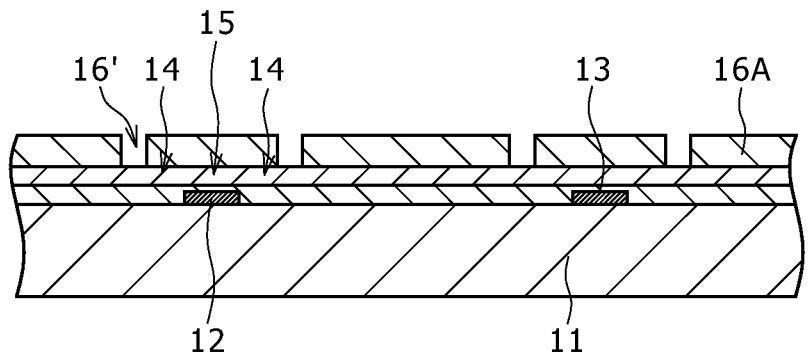
FIGS. 5A to 5C are schematic partly sectional views showing the first substrate etc., which serve to outline the steps for production of the organic electroluminescence display device according to Example 1.
Figure 5B:
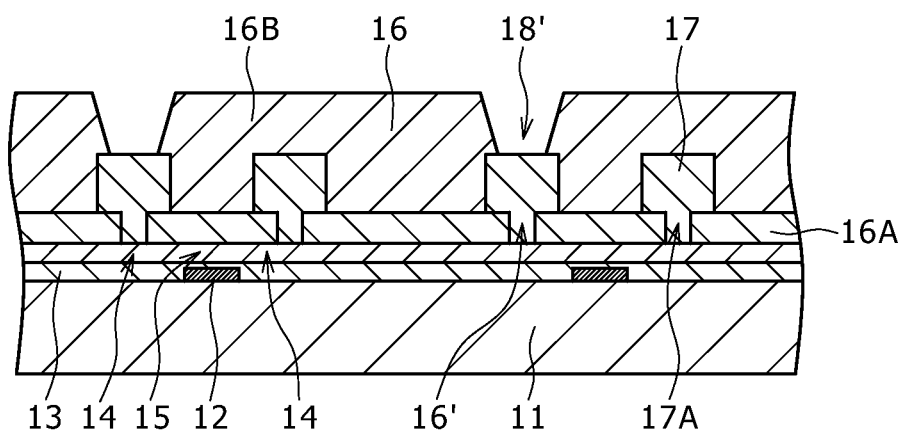
Figure 5C:
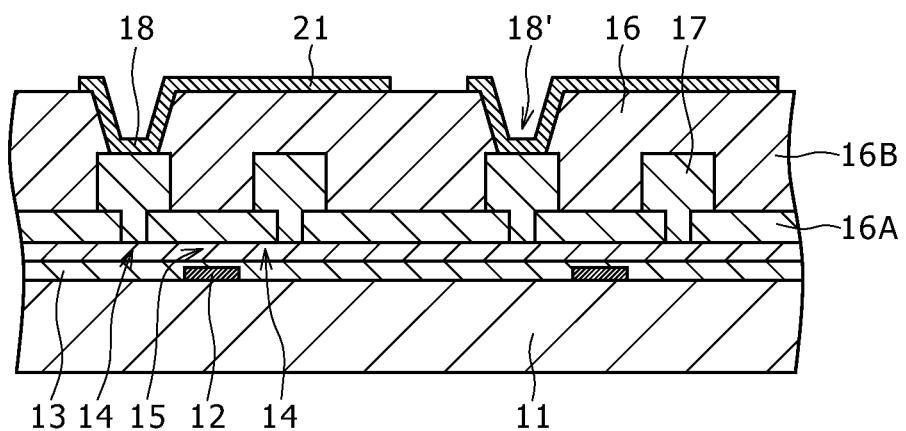
Figure 6A:
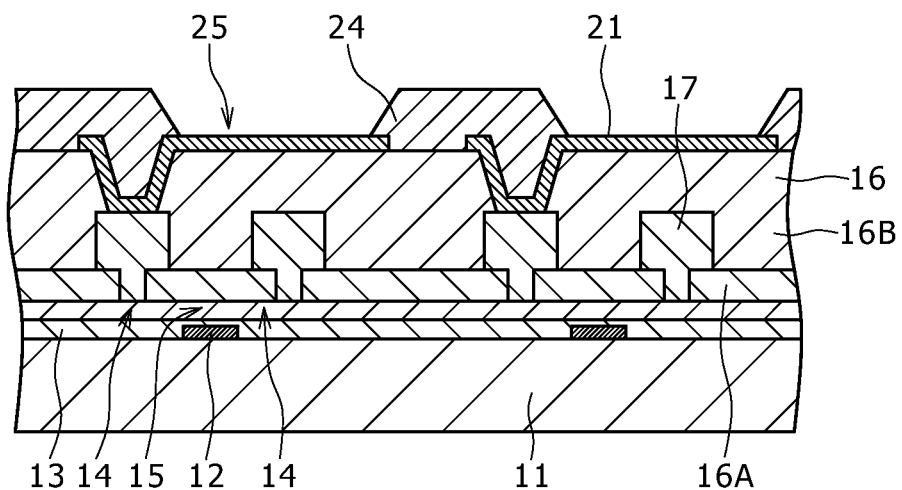
FIGS. 6A and 6B are schematic partly sectional views showing the first substrate etc., which serve to outline the steps (which follow the step shown in FIG. 5C) for production of the organic electroluminescence display device according to Example 1.
Figure 6B:
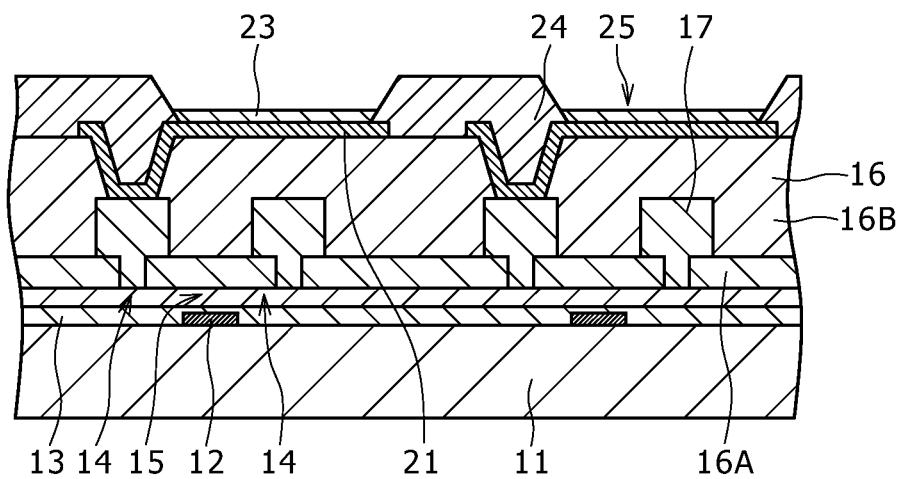
Figure 7A:
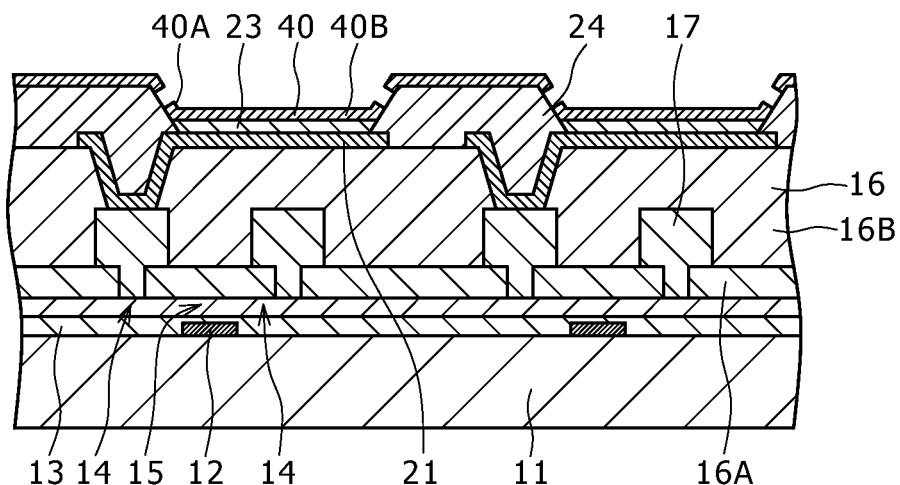
FIGS. 7A and 7B are schematic partly sectional views showing the first substrate etc., which serve to outline the steps (which follow the step shown in FIG. 6B) for production of the organic electroluminescence display device according to Example 1.
Figure 7B:
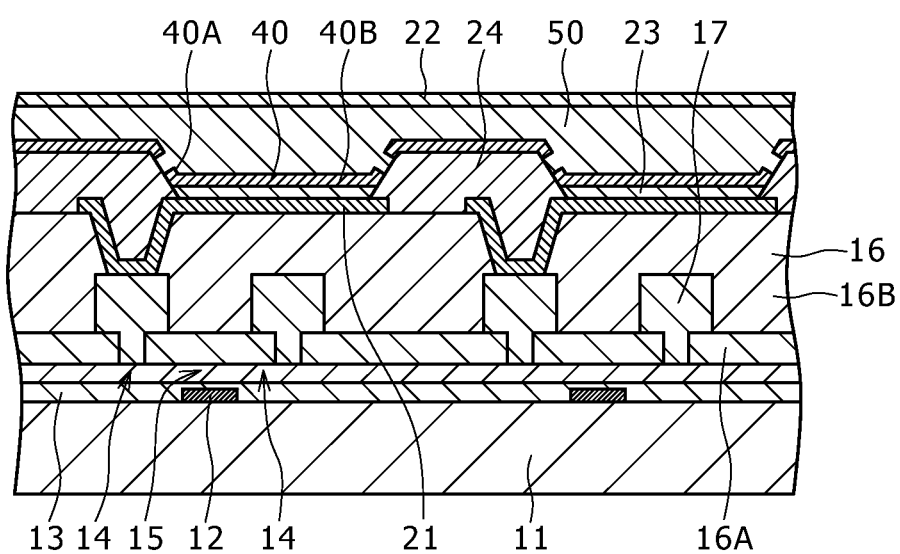

The upper interlayer insulating layer 16B undergoes vacuum deposition and etching in combination to form the first electrode 21 of Al—Nd alloy. (See FIG. 5C.) Incidentally, the first electrode 21 is electrically connected to the wiring 17 through the contact plug 18 formed in the opening 18'.

(Step-130)

The insulating layer 24, which permits the first electrode 21 to expose itself at the bottom of its opening 25, is formed on the interlayer insulating layer 16 including the first electrode 21. (See FIG. 6A.) To be more specific, the insulating layer 24 (1 µm thick) of polyimide resin is formed by spin coating and etching on the interlayer insulating layer 16 and the periphery of the first electrode 21. Incidentally, that part of the insulating layer 24 which surrounds the opening 25 should preferably be gently sloped.

(Step-140)

Then the organic layer 23 is formed which extends from above the first electrode 21 which exposes itself at the bottom of the opening 25 to that part of the insulating layer 24 which surrounds the opening 25. (See FIG. 6B.) Incidentally, the organic layer 23 is composed of two layers placed one over another, which are the hole transporting layer of organic material and the light-emitting layer which functions also as the electron transporting layer. To be more specific, a metal mask (not shown) is placed on the projections of the insulating layer 24 by using the insulating layer 24 as a spacer. Vacuum deposition with an organic material is performed by resistance heating to form the organic layer 23 which constitutes sub-pixels on the insulating layer 24. The organic material passes through the openings in the metal mask and accumulates on that part of the insulating layer 24 which surrounds the opening 25 from above that part of the first electrode 21 (constituting the sub-pixels) which exposes itself at the bottom of the opening 25.

(Step-150)

Then, the first half-transmitting/reflecting film 41 and the second half-transmitting/reflecting film 42 are sequentially formed on the entire surface of the display region. (See FIG. 7A.) The half-transmitting/reflecting film 40 entirely covers the organic layer 23 which constitutes as many organic EL elements as N×M. However, the half-transmitting/reflecting film 40 on the insulating layer 24 is at least partly discontinuous as mentioned above. The half-transmitting/reflecting film 40 is formed by vacuum deposition with particle energy small enough not to adversely affect the organic layer 23. The first half-transmitting/reflecting film 41 and the second half-transmitting/reflecting film 42 are formed under the conditions shown in Table 7 below. The second half-transmitting/reflecting film 42 can be obtained by code-position with Mg—Ag alloy (10:1 by volume). The half-transmitting/reflecting film 40 is formed continuously in the same vacuum deposition apparatus used for the organic layer 23, so that the organic layer 23 is protected from deterioration by moisture and oxygen in the atmospheric air. Incidentally, the half-transmitting/reflecting film 40 should preferably be formed in such a way that it does not cover completely so that the discontinuous state is intentionally obtained. This can be achieved by keeping the pressure low (say, lower than $1 \times 10^{-3}$ Pa) to form the film.

Table 7

Condition for vacuum deposition to form the first half-transmitting/reflecting film 41
   Ca heating temperature: 480° C.
   Ca film forming rate: 0.05 nm/sec Condition for vacuum deposition to form the second half-transmitting/reflecting film 42
   Mg heating temperature: 280° C.
   Mg film forming rate: 0.05 nm/sec
   Ag heating temperature: 1100° C.
   Ag film forming rate: $0.05 \times \{x/(100+x)\}$ nm/sec
   where, x denotes Ag concentration (%).

(Step-160)

Then, the resistance layer 50 (which is 0.5 μm thick at the part above the organic layer 23) is formed by sputtering from niobium oxide ($Nb_2O_5$) having an electrical resistance of $1 \times 10^4$ Ω·m ($1 \times 10^6$ Ω·cm). The resistance layer 50 is in contact with the second electrode 22 but it has a high resistance so that the current flowing through it is smaller than one-tenth the current flowing through one entire sub-pixel. This leads to the advantage that such defects as dark spots or half-dark spots are not recognized in the displayed image even when the state shown in FIG. 3A occurs. In the case where the resistance layer 50 is formed from $Nb_2O_5$, the characteristic properties required of it are as shown above. It should preferably have an electrical resistance of $1 \times 10^2$ to $1 \times 10^4$ Ω·m. Moreover, the resistance layer 50 should preferably be formed at a high pressure (say, 0.1 to 10 Pa) in view of the fact that it creeps around when it is formed. In the case where the resistance layer 50 is formed from an oxide semiconductor, it would vary in electrical resistance depending on the concentration of oxygen (or partial pressure of oxygen) for film formation; however, if it is formed form $Nb_2O_5$ it varies in electrical resistance only in a small range, say, from $1 \times 10^2$ to $1 \times 10^4$ Ω·m ($1 \times 10^4$ to $1 \times 10^6$ Ω·cm) even though the oxygen partial pressure fluctuates in the range of $1 \times 10^{-4}$ to $1 \times 10^{-2}$ Pa. This ensures a stable electrical resistance.

(Step-170)

Then, the second electrode 22 is formed over the entire surface of the display region. (See FIG. 7B.) The second electrode 22 covers the entire surface of the organic layer 23 constituting the N×M organic EL elements. However, the second electrode 22 is insulated from the first electrode 21 by the organic layer 23 and the insulating layer 24. The second electrode 22 is also formed by long throw magnetron sputtering with a low particle energy which does not adversely affect the organic layer 23. The second electrode 22 is formed continuously in the same vacuum deposition apparatus as used for the organic layer 23 so that the organic layer 23 is protected against deterioration by moisture and oxygen in the atmospheric air. To be more specific, the second electrode 22 is obtained by forming an ITO layer (0.1 μm thick) over the entire surface.

(Step-180)

Then, the second electrode 22 is coated with the insulating protective film 31 of amorphous silicon nitride ($\alpha$-$Si_{1-x}N_x$) by plasma CVD. The protective film 31 is formed continuously without the second electrode 23 being exposed to the atmospheric air, so that the organic layer 23 is protected from deterioration by moisture and oxygen in the atmospheric air. After that, the protective film 31 and the second substrate 33 are bonded together with the adhesion layer 32 of acrylic adhesive. Finally, connection with external circuits is made to complete the organic EL display device.

Incidentally, the second half-transmitting/reflecting film 42 may be formed from magnesium-calcium (Mg—Ca) in place of magnesium-silver (Mg—Ag). In this case, the ratio of magnesium to calcium (Mg:Ca) is 9:1 by volume and the second half-transmitting/reflecting film has a thickness of 2 nm. The second half-transmitting/reflecting film may be formed by vacuum deposition.

EXAMPLE 2

Example 2 is a modification of Example 1, with difference between them lying in that the resistance layer is composed of a first resistance layer and a second resistance layer, which are laminated one over another on the organic layer, and the second resistance layer has a higher electrical resistance than the first resistance layer. In Example 2, both the first resistance layer and the second resistance layer are formed from $Nb_2O_5$ by sputtering. This sputtering is carried out in such a way that the partial pressure of oxygen is varied with time so that the first resistance layer and the second resistance layer have the electrical resistance $R_1$ and $R_2$, respectively, which are defined as follows.

Electrical resistance ($R_1$) of the first resistance layer:
   $1 \times 10^2$ Ω·m ($1 \times 10^4$ Ω·cm)
Electrical resistance ($R_2$) of the second resistance layer:
   $1 \times 10^4$ Ω·m ($1 \times 10^6$ Ω·cm)

The voltage drop across the resistance layer was smaller in Example 2 than in the case of a single resistance layer having an electrical resistance of $1 \times 10^4$ Ω·m ($1 \times 10^6$ Ω·cm). This leads to a reduced driving voltage.

With exception for the structure of the resistance layer, there is no difference between Example 1 and Example 2 in the structure of the organic EL display device, light-emitting element, and organic EL element. Therefore, Example 2 will not be explained in more detail.

EXAMPLE 3

Example 3 is also a modification of Example 1. Example 1 is characterized in that the resistance layer constituting the red emitting element has an electrical resistance of $R_R$, the resistance layer constituting the green emitting element has an electrical resistance of $R_G$, and the resistance layer constituting the blue emitting element has an electrical resistance of $R_B$, which are identical. (The electrical resistance is that per unit area of the resistance layer.) In other words, the entire surface is uniformly covered with the resistance layer. In the meantime, each of the red, green, and blue emitting elements has an optical distance of $OL_R$, $OL_G$, and $OL_B$, respectively, such that $OL_B$, is shorter than $OL_R$ and $OL_G$. Consequently, the organic layer in the blue emitting element needs to be thinner than that in the green and red emitting elements. This makes it liable for short-circuiting to occur between the first and second electrodes in the blue emitting element. On the other hand, the driving voltage, which depends on the material of the light emitting element and the thickness of the organic layer, tends to increase in the order of the blue, green, and red emitting elements. However, it is desirable that the blue, green, and red emitting elements have a uniform driving voltage. Moreover, it is also desirable to minimize variation in their driving voltage as far as possible. In addition, pixels tend to increase in the number of dark spots in proportion to their area, assuming that (area of red emitting element)≦(area of green emitting element)<(area of blue emitting element).

Figure 8:
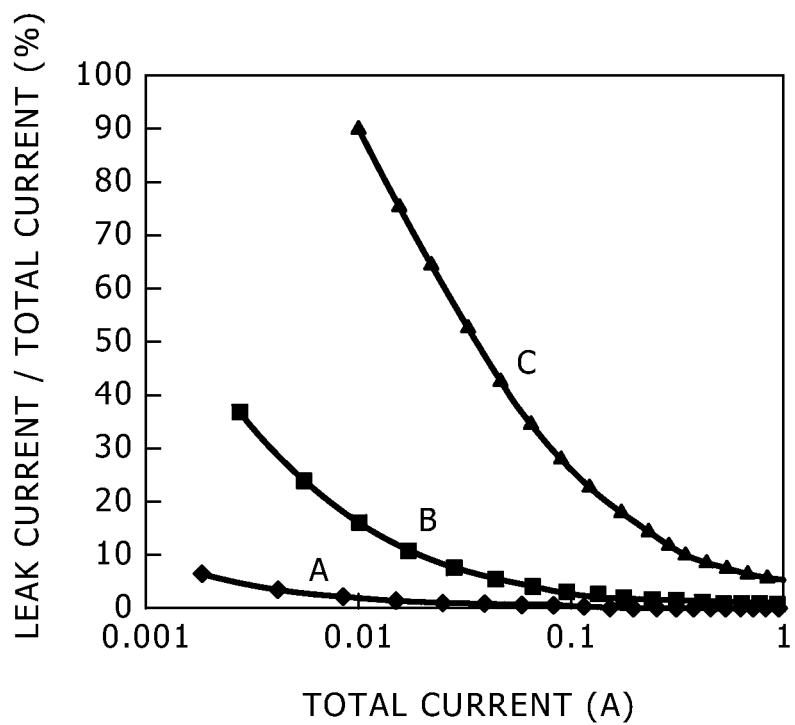
FIG. 8 is a graph showing the ratio of leak current to total current which is observed in simulation when the total current to drive pixels changes.

FIG. 8 is a graph showing the ratio of leak current to total current which is observed in simulation when the total current to drive pixels changes. It is noted that according as the total current decreases, the ratio of leak current due to foreign matter increases. It is also noted that according as the resistance of the resistance layer increases, the leak current is suppressed. Incidentally, in FIG. 8, the curves "A," "B," and "C" represent respectively data obtained when the resistance layer has a resistance of $1 \times 10^4$ Ω, $1 \times 10^5$ Ω, and $1 \times 10^6$ Ω.

Example 3 is designed such that $R_B > R_G$ and $R_B > R_R$, where $R_R$, $R_G$, and $R_B$ denote respectively the resistance per unit area of the resistance layer constituting the red, green, and blue light-emitting elements, so that these light-emitting elements have as uniform driving voltages as possible. To be more specific, $R_B = 150$ Ω·$^2$, $R_G = 50$ Ω·cm$^2$, and $R_R = 100$ Ω·cm$^2$. Thus the red, green, and blue light-emitting elements have a uniform driving voltage which increases very little, with an additional effect of preventing short-circuiting across the first and second electrodes.

The red, green, and blue light-emitting elements are constructed such that their resistance layers differ in thickness from one another. To be more specific, this is accomplished in the following way. First, the resistance layer is formed. That part of the resistance layer which constitutes the blue light-emitting element is coated with a resist layer, and that part of the resistance layer which constitutes the green and red light-emitting elements is exposed and partly undergoes etching in the thicknesswise direction of the resistance layer. Subsequently, the resist layer is removed, and the resistance layer constituting the blue and red light-emitting elements is exposed and partly undergoes etching in the thicknesswise direction of the resistance layer. Alternatively, the resistance layers constituting respectively the red, green, and blue light-emitting elements are formed from different materials. (For example, in Example 2, the first and second resistance layers are formed and then that part of the resistance layer which is above the red and green light-emitting elements is removed by etching.) Alternatively, the resistance layers constituting respectively the red, green, and blue light-emitting elements are made to vary in the content of the substance responsible for the conductivity of the resistance layer.

EXAMPLE 4

Figure 9:
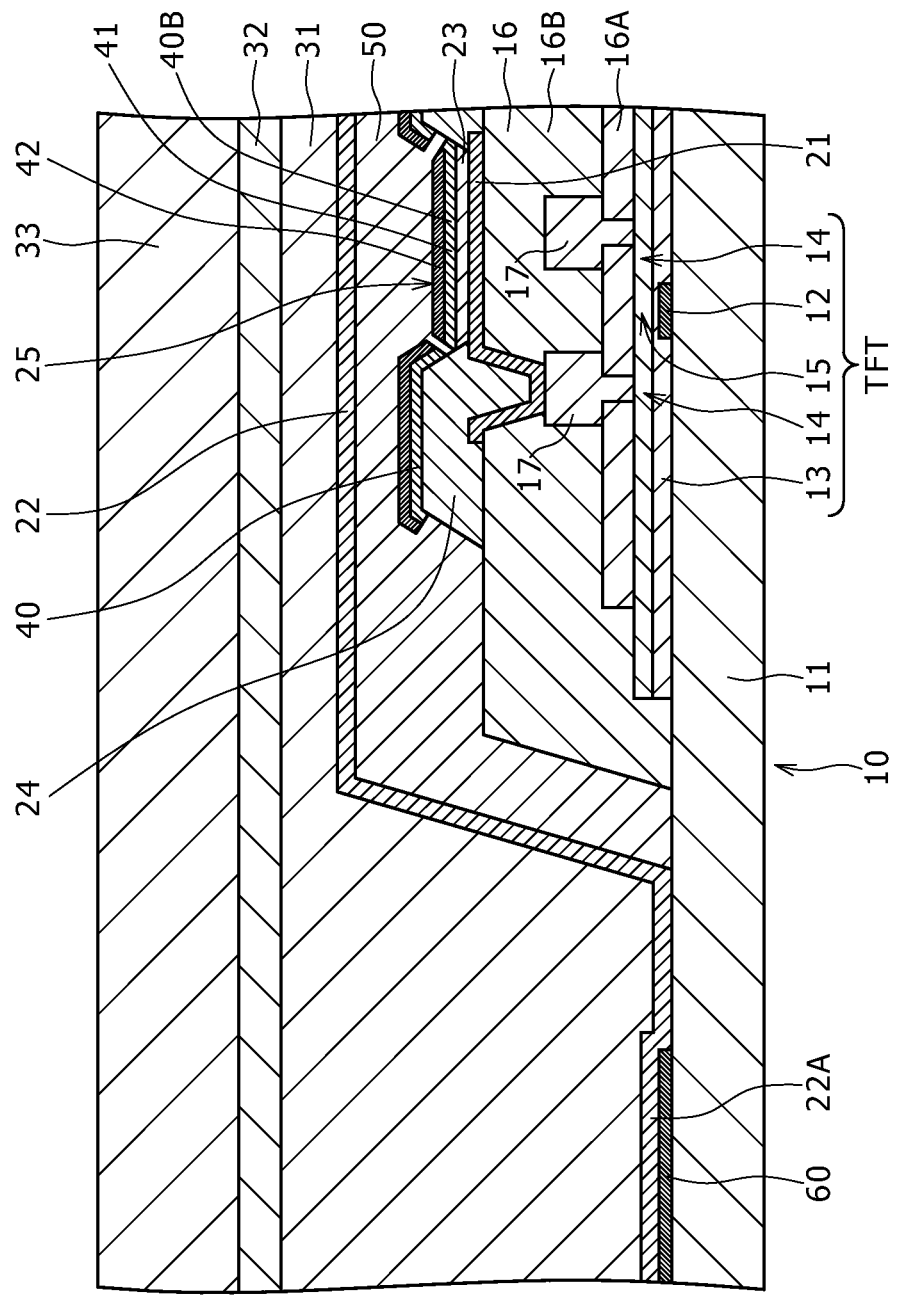
FIG. 9 is a schematic partly sectional view showing the peripheral part of the organic electroluminescence display device according to Example 4.
Figure 10:
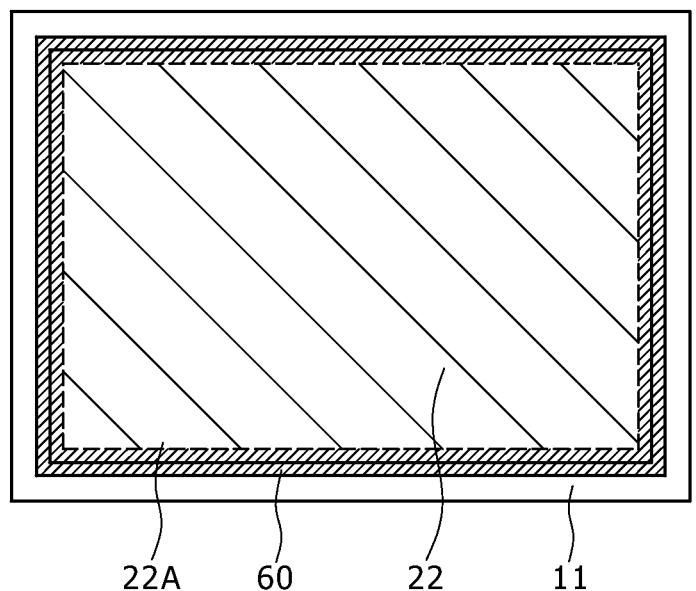
FIG. 10 is a schematic diagram illustrating the arrangement of the lead-out electrode and the second electrode near the periphery of the organic electroluminescence display device according to Example 4.

Example 4 is also a modification of Example 1. According to Example 4, the lead-out electrode 60 to connect the second electrode 22 to the external circuit (not shown) is arranged in the peripheral region of the organic EL display device. In Example 4, the lead-out electrode 60 is arranged in the peripheral part of the first substrate 11, and it is formed from a titanium (Ti) film. The second electrode 22 has the extending part 22A which reaches above the lead-out electrode 60. FIG. 9 is a schematic partly sectional view showing the peripheral part of the organic EL display device according to Example 4. FIG. 10 is a schematic diagram illustrating the arrangement of the lead-out electrode 60 and the second electrode 22 near the periphery of the organic EL display device according to Example 4. In FIG. 10, solid lines and dotted lines indicate respectively the external and internal peripheries of the lead-out electrode 60, and diagonal lines (from upper right to lower left) signify the lead-out electrode 60. In addition, diagonal lines (from upper left to lower right) signify the second electrode 22 including its extended part 22A. The lead-out electrode 60 may be formed during "Step-100" or "Step-130" in Example 1 or between them by sputtering and etching in combination, PVD with a metal mask, or lift-off method, in such a way that it surrounds the display region as if it forms a picture frame. Incidentally, in the case where the lead-out electrode 60 forms a portion that overlaps with wirings arranged on the first substrate 11, an insulating film may optionally be formed between the lead-out electrode 60 and the wirings.

EXAMPLE 5

Figure 11:
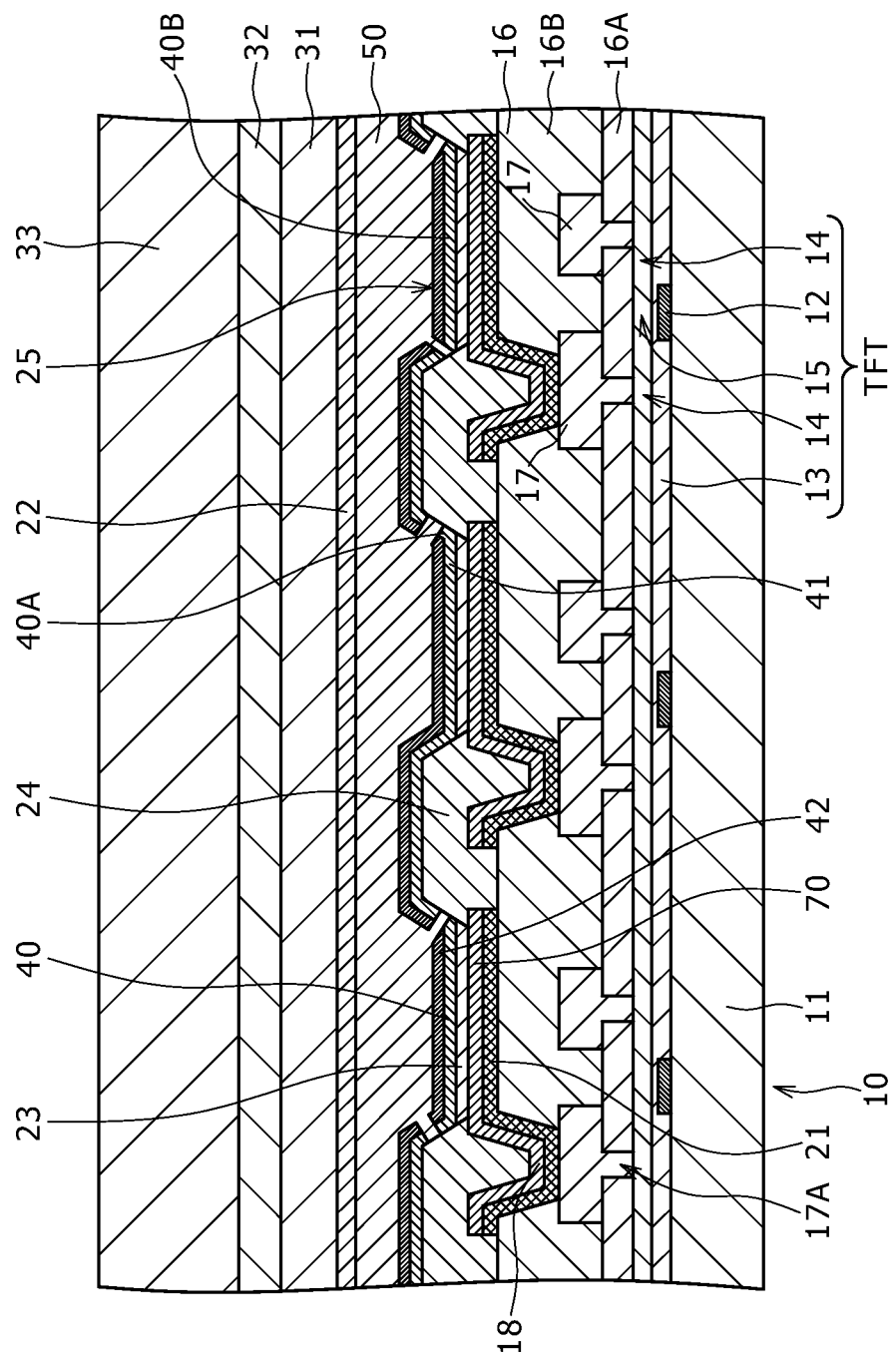
FIG. 11 is a schematic partly sectional view showing the organic electroluminescence display device according to Example 5.
Figure 12A:
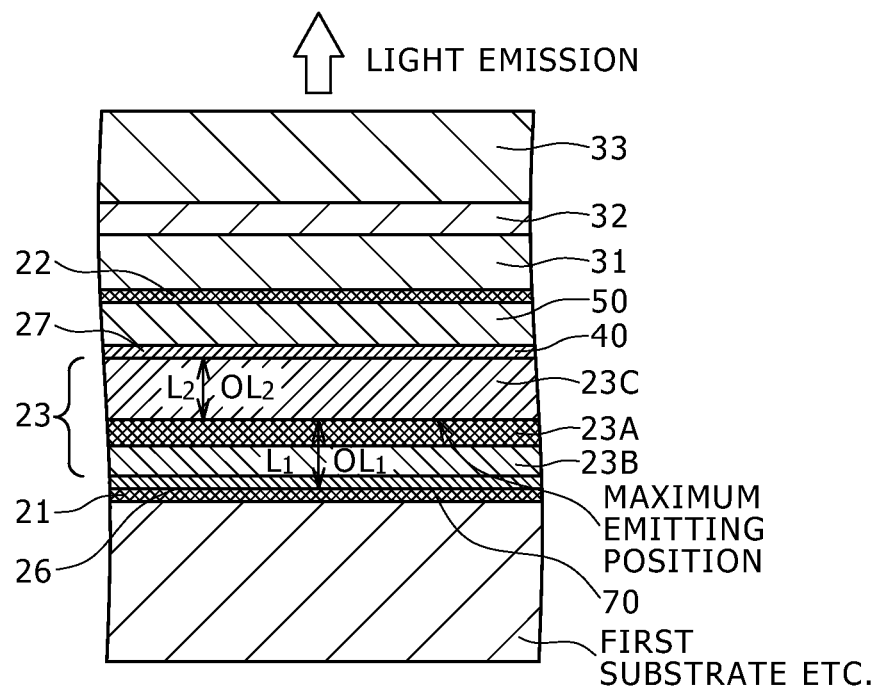
FIGS. 12A and 12B are schematic diagrams showing the light-emitting element according to Example 5.
Figure 12B:
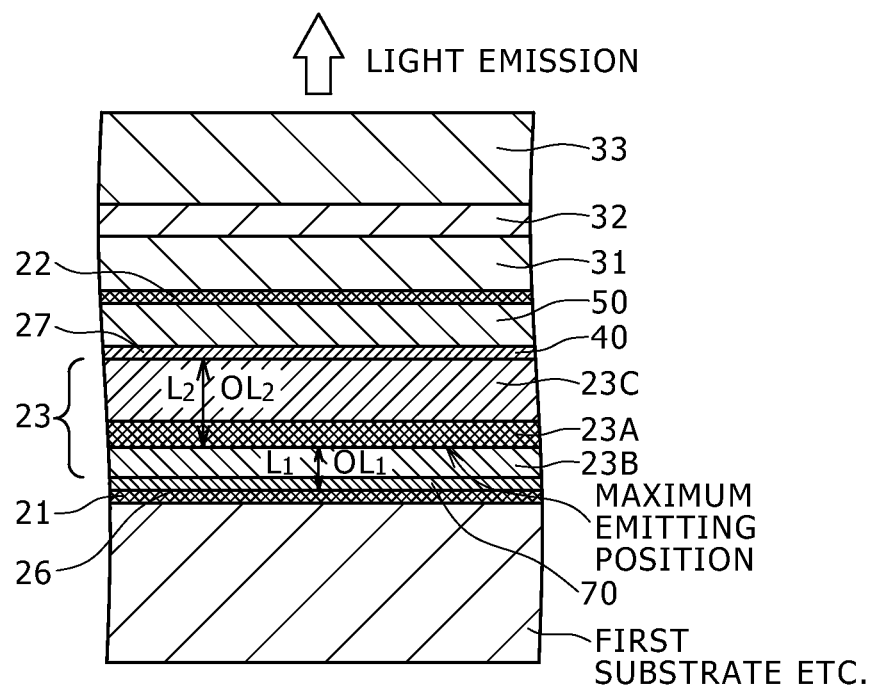

Example 5 is also a modification of Example 1. The light-emitting element (organic EL element) of Example 5, which is shown in FIG. 11 and FIGS. 12A and 12B, has the conductive film 70 between the first electrode 21 and the organic layer 23. The conductive film 70 transmits a portion of light from the light-emitting layer 23A. The first electrode 21 reflects the light that has passed through the conductive film 70. The conductive film 70 on the first electrode 21 has an average film thickness of 1 to 6 nm, and it is formed from an alloy of alkali metal or alkaline earth metal and silver (Ag). It is a 2-nm thick film of Mg—Ag composed of Mg:Ag=10:1 by volume. The first electrode 21 and the conductive film 70 in a desired pattern are formed by vacuum deposition and etching in combination. The conductive film 70 has a light transmission of 70%. Incidentally, the Mg—Ag alloy for the conductive film 70 may be replaced by the Mg—Ca alloy composed of Mg:Ca=9:1 by volume. The conductive film has a thickness of 2 nm. Incidentally, in FIGS. 11, 12A and 12B and FIGS. 13A and 13B given later, the half-transmitting/reflecting film 40 is indicated by a single layer.

The light-emitting element according to Example 5 has the conductive film 70 formed between the first electrode 21 and the organic layer 23. This structure reduces electrical resistance across the organic layer 23 and the first electrode 21. This leads to a reduced driving voltage. The reduced driving voltage decreases field intensity that is applied across the first electrode 21 and the second electrode 22, which leads to a decrease in dark points due to leak current and a considerable decrease in power consumption. To be more specific, as compared with the light-emitting element which does not have the conductive film 70 formed between the first electrode 21 and the organic layer 70, the light-emitting element of Example 6 which has the conductive film 70 decreases in driving voltage by 1.1 to 1.32 volts.

Incidentally, the light-emitting element explained in Examples 2 to 4 can be applied to the light-emitting element and the organic EL display device according to Example 5 as a matter of course.

EXAMPLE 6

Figure 13A:
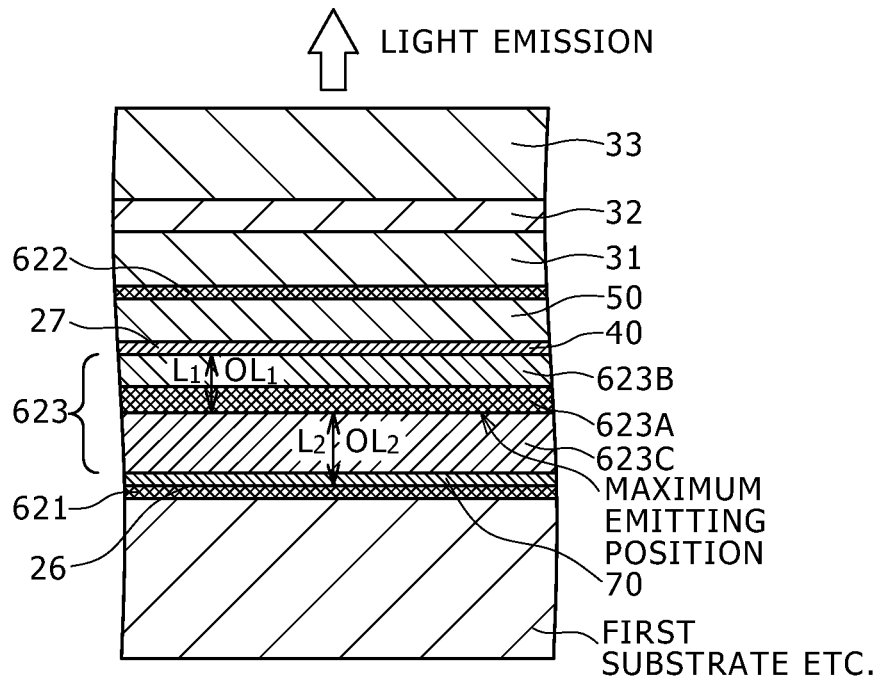
FIGS. 13A and 13B are schematic diagrams showing the light-emitting element according to Example 6.
Figure 13B:
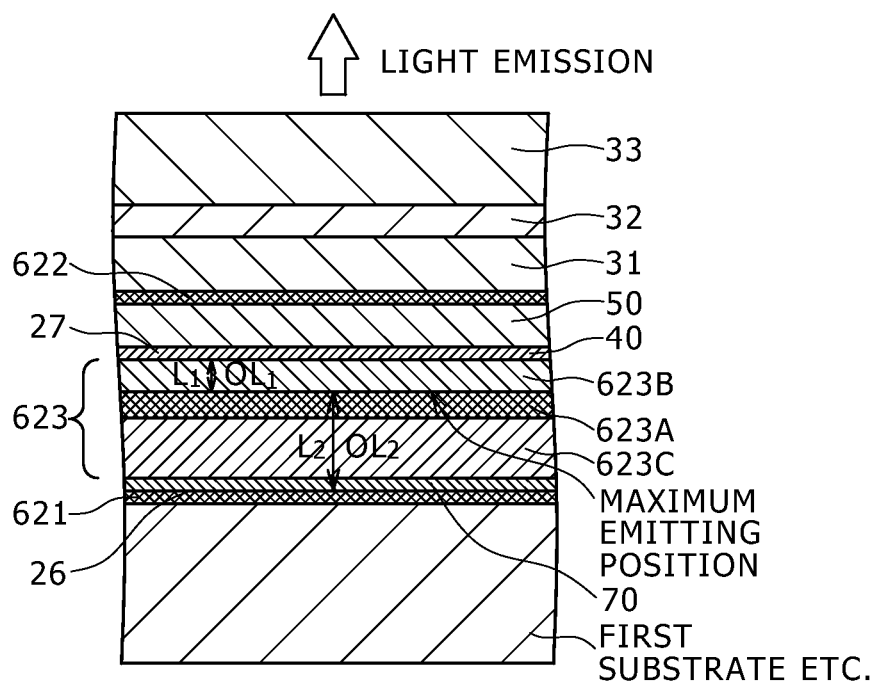

Example 6 is a modification of Example 5. FIGS. 13A and 13B are schematic diagrams showing the organic layer in the light-emitting element of Example 6. Incidentally, the organic EL display device of Example 6, to which the light-emitting element of Example 6 is applied, is identical in structure with the organic EL display device explained in Example 5 except that the organic layer has a different structure and the first and second electrodes function as cathode and anode, respectively. Its schematic partly sectional view is identical with FIG. 11 except for reference numbers, and hence it is not explained in more detail.

The light-emitting element (organic EL element) of Example 6 is composed of the following components which are sequentially laminated one over another.

(A) first electrode 621,
(B) conductive film 70,
(C) organic layer 623 having the light-emitting layer 623A made of an organic light-emitting material,
(D) half-transmitting/reflecting film (including the first half-transmitting/reflecting film 41 and the second half-transmitting/reflecting film 42 which are laminated in this order from a side of the organic layer 623),
(E) resistance layer 50, and
(F) second electrode 622.

Example 6 differs from Example 5 in that the organic layer 623 includes the electron transporting layer 623C, the light-emitting layer 623A, the hole transporting layer, and the hole injection layer, which are laminated in this order from a side of the first electrode 621. However, in the figures, the organic layer 623 may be shown as a single layer or the hole injection layer and hole transporting layer altogether may be shown as a single layer of the hole transporting layer 623B. The first electrode 621 reflects light from the light-emitting layer 623A, the second electrode 622 transmits light from the light-emitting layer 623A, and the half-transmitting/reflecting film 40 on the organic layer 623 as a whole has an average film thickness of 1 to 6 nm.

Incidentally, Example 6 is identical with Example 5 in that the light-emitting element has the conductive film 70 between the first electrode 621 and the organic layer 623, the conductive film 70 transmits a portion of light from the light-emitting layer 623A, the first electrode 621 reflects light from the light-emitting layer 623A, and the conductive film 70 on the first electrode 621 has an average film thickness of 1 to 6 nm.

In Example 6, the first electrode 621 is used as the cathode and the second electrode 622 is used as the anode. To be more specific, the first electrode 621 has a thickness of 0.3 μm and is made of light-reflecting material such as Al—Nd alloy, and the second electrode 622 has a thickness of 0.1 μm and is made of transparent conductive material such as ITO. The half-transmitting/reflecting film 40 is constructed in the same way as in Example 5. However, Example 6 differs from Example 5 in that the electron injection layer of LiF is not formed between the organic layer 623 and the half-transmitting/reflecting layer 40; instead, the electron injection layer (not shown) of LiF (0.3 nm thick) is formed between the organic layer 623 and the conductive film 70.

To sum up, the light-emitting element of Example 6 has the structure as shown in Table 8. The first electrode 621 and the second electrode 622 were examined for refractive index. The first electrode 621 was examined for light reflectance. The half-transmitting/reflecting film 40 and the conductive film 70 were examined for light transmittance. The results are shown in Table 9. Incidentally, the measurements were carried out at a wavelength of 530 nm.

TABLE 8

| | |
|---|---|
| Second substrate 33 | Soda glass |
| Adhesion layer 32 | Acrylic adhesive |
| Protective film 31 | $SiN_x$ layer (5 nm thick) |
| Second electrode (anode) 622 | ITO layer (0.1 μm thick) |
| Resistance layer 50 | $Nb_2O_5$ layer (0.5 μm thick) |
| Half-transmitting/reflecting film | |
| Second half-transmitting/reflecting film 42 | Mg—Ag film |
| First half-transmitting/reflecting film 41 | Ca film |
| Electron injection layer | LiF layer (0.3 nm thick) |
| Organic layer 623 | Mentioned later |
| Conductive film 70 | Mg—Ag film (2 nm thick) |
| First electrode (cathode) 621 | Al—Nd layer (0.3 μm thick) |
| Interlayer insulating layer 16 | $SiO_2$ layer |
| TFT | Constituting the driving unit for organic EL element |
| First substrate 11 | Soda glass |

TABLE 9

| | Real part | Imaginary part |
|---|---|---|
| Refractive index of the first electrode 621 | 0.755 | 5.466 |
| Refractive index of the half-transmitting/reflecting film 40 | 0.617 | 3.904 |
| Refractive index of conductive film 70 | 0.617 | 3.904 |
| Refractive index of the second electrode 622 | 1.814 | 0 |
| Refractive index of the resistance layer 50 | 2.285 | 0 |
| Refractive index of the protective film 31 | 1.87 | 0 |
| Refractive index of the adhesion layer 32 | 1.53 | 0 |
| Light reflectance of the first electrode 621 | | 85% |
| Light transmittance of half-transmitting/reflecting film 40 and the conductive film 70 | | 60% |
| Light transmittance of conductive film 70 | | 79% |
| Light transmittance of the second electrode 622 | | 2% |

Example 6 is characterized by its light-emitting mechanism as explained below. The light emitted from the light-emitting layer 623A resonates between the first interface 26 and the second interface 27 (the former existing between the first electrode 621 and the organic layer (more specifically the conductive film 70), and the latter existing between the half-transmitting/reflecting layer 40 and the organic layer 623). And the resonated light partly emerges from the half-transmitting/reflecting layer 40 and then the second electrode 622.

The light-emitting element of Example 6 has the optical distances $OL_1$ and $OL_2$ which satisfy the formulas (1-1) and (1-2) mentioned above, where $OL_1$ is the distance between the first interface 26 and the maximum emitting position of the light-emitting layer 623A and $OL_2$ is the distance between the second interface 27 and the maximum emitting position of the light-emitting layer 623A, as shown in FIGS. 13A and 13B.

Moreover, the light-emitting element of Example 6 has the optical distance OL between the first interface 26 and the second interface 27 which satisfies the formula below, in which Φ (in radians, $-2\Pi<\Phi\leq0$) denotes the total phase shift that occurs when the light emitted by the light-emitting layer 623A is reflected by the first interface 26 and the second interface 27 and λ denotes the maximum peak wavelength of the spectrum of the light emitted by the light-emitting layer 623A.

$$-0.3\leq\{(2\times OL)/\lambda+\Phi/(2\Pi)\}\leq0.3$$

That is, the red light-emitting element (red light-emitting organic EL element) causes the light-emitting layer 623A to emit light and causes the emitted light to resonate between the first interface 26 and the second interface 27 and permits a portion of the light to emerge from the second electrode 622. The light emitted by the light-emitting layer 623A has the maximum peak wavelength of spectrum ranging from 600 to 650 nm (more specifically 620 nm in Example 6). The organic layer 623 on the first electrode 621 has a film thickness of $1.1 \times 10^{-7}$ to $1.6 \times 10^{-7}$ m (more specifically 140 nm in Example 6).

More specifically, the red emitting organic layer is constructed as shown in Table 10 below. The maximum emission position is at the interface between the electron transporting layer 623C and the light-emitting layer 623A. (See FIG. 13A.) In Table 10 or Tables 11 and 12 mentioned later, the layers are arranged such that they become closer to the first electrode as they come down.

TABLE 10

|  | Material | Film thickness |
| --- | --- | --- |
| Hole injection layer | LG Chemical: LGHIL | 10 nm |
| Hole transporting layer | Idemitsu Kosan: HT320 | 20 nm |
| Light-emitting layer | Idemitsu Kosan: RH001 + Toray: D125 (0.5% doped) | 50 nm |
| Electron transporting layer | Idemitsu Kosan: ET085 | 60 nm |

Also, the green light-emitting element (green light-emitting organic EL element) causes the light-emitting layer 623A to emit light and causes the emitted light to resonate between the first interface 26 and the second interface 27 and permits a portion of the light to emerge from the second electrode 622. The light emitted by the light-emitting layer 623A has the maximum peak wavelength of spectrum ranging from 500 to 550 nm (more specifically 530 nm in Example 6). The organic layer 623 on the first electrode 621 has a film thickness of $9 \times 10^{-8}$ to $1.3 \times 10^{-7}$ m (more specifically 118 nm in Example 6).

More specifically, the green emitting organic layer is constructed as shown in Table 11 below. The maximum emission position is at the interface between the hole transporting layer 623B and the light-emitting layer 623A. (See FIG. 13B.)

TABLE 11

|  | Material | Film thickness |
| --- | --- | --- |
| Hole injection layer | LG Chemical: LGHIL | 10 nm |
| Hole transporting layer | Idemitsu Kosan: HT320 | 48 nm |
| Light-emitting layer | Idemitsu Kosan: BH232 + GD206 (10% doped) | 30 nm |
| Electron transporting layer | Idemitsu Kosan: ET085 | 30 nm |

Also, the blue light-emitting element (blue light-emitting organic EL element) causes the light-emitting layer 623A to emit light and causes the emitted light to resonate between the first interface 26 and the second interface 27 and permits a portion of the light to emerge from the second electrode 622. The light emitted by the light-emitting layer 623A has the maximum peak wavelength of spectrum ranging from 430 to 480 nm (more specifically 460 nm in Example 6). The organic layer 623 on the first electrode 621 has a film thickness of $6 \times 10^{-8}$ to $1.1 \times 10^{-7}$ m (more specifically 88 nm in Example 6).

More specifically, the blue emitting organic layer is constructed as shown in Table 12 below. The maximum emission position is at the interface between the hole transporting layer 623B and the light-emitting layer 623A. (See FIG. 13B.)

TABLE 12

|  | Material | Film thickness |
| --- | --- | --- |
| Hole injection layer | LG Chemical: LGHIL | 10 nm |
| Hole transporting layer | Idemitsu Kosan: HT320 | 28 nm |
| Light-emitting layer | Idemitsu Kosan: BH232 + BD218 (10% doped) | 30 nm |
| Electron transporting layer | Idemitsu Kosan: ET085 | 20 nm |

The light-emitting element according to Example 6 has the organic layer 623 which is composed of the electron transporting layer 623C, the light-emitting layer 623A, the hole transporting layer, and the hole injection layer laminated on top of the other (the first one being close to the first electrode 621). This structure improves electron injection into the light-emitting layer 623A, thereby reducing the driving voltage. The reduced driving voltage reduces the electric field intensity between the first electrode 621 and the second electrode 622, which in turn reduces dark points due to leak current and considerably reduces power consumption.

More specifically, the light-emitting element of Example 6 has a lower driving voltage by 1.7 to 2.6 V than that of Example 5.

Figure 14A:
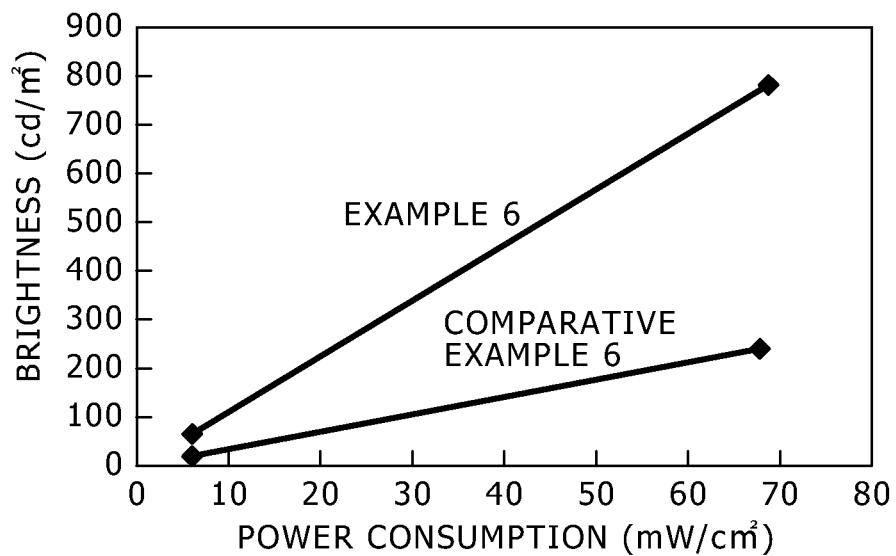
FIGS. 14A and 14B are graphs showing respectively the relation between brightness and power consumption and the relation between driving voltage and current density, both measured for the light-emitting elements according to Example 6 and Comparative Example 6.
Figure 14B:
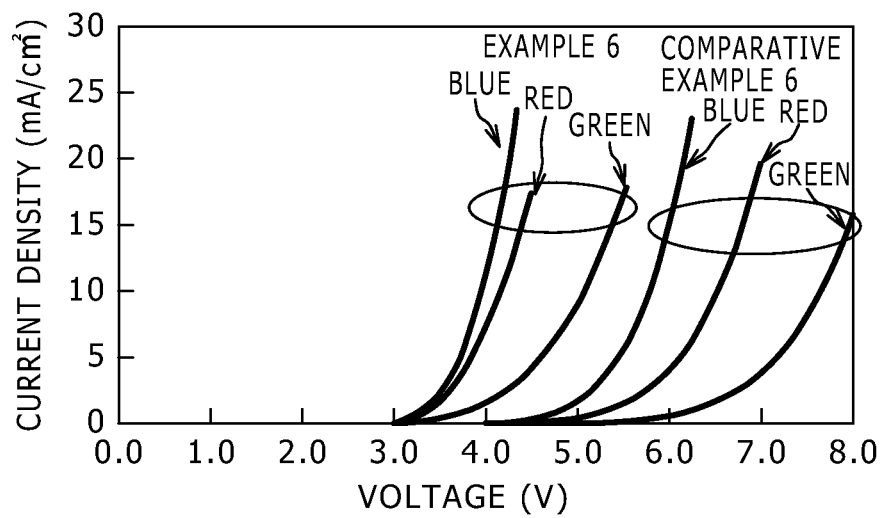

The light-emitting element of Example 6 was compared with that in Comparative Example 6, which does not have the conductive film 70, for relation between power consumption and brightness and relation between driving voltage and current density. The results are shown in FIGS. 14A and 14B, respectively. It is noted that the light-emitting element of Example 6 has better brightness characteristics and lower current densities than that of Comparative Example 6.

The light-emitting element and the organic EL display device of Example 6 can be produced substantially in the same way as for those in Example 1; therefore, the description of their production method is omitted.

Incidentally, the light-emitting element explained in Examples 2 to 4 can be applied to the light-emitting element and the organic EL display device according to Example 6, as a matter of course.

EXAMPLE 7

Figure 16A:
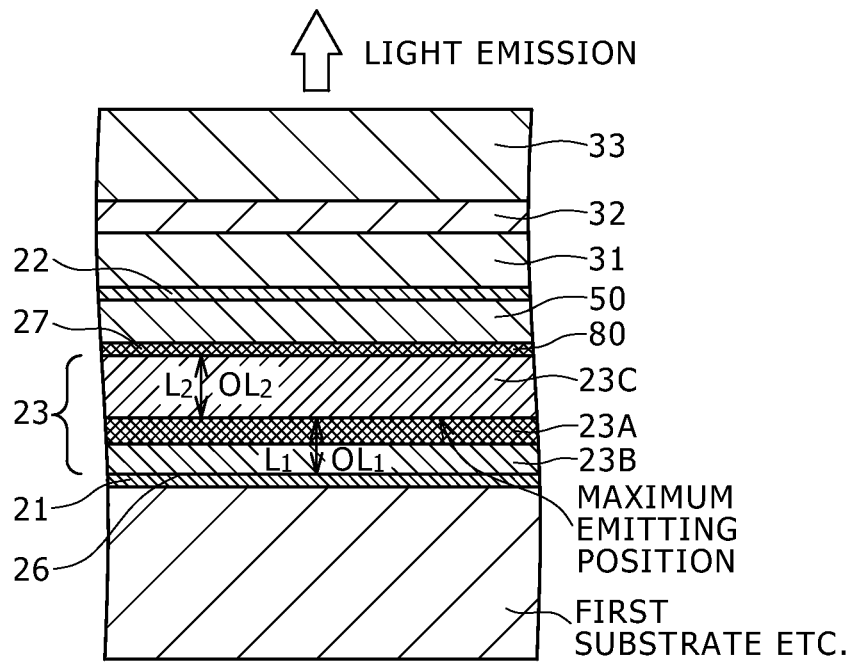
FIGS. 16A and 16B are schematic diagrams showing the organic layer etc. in the organic electroluminescence display device according to Example 7.
Figure 16B:
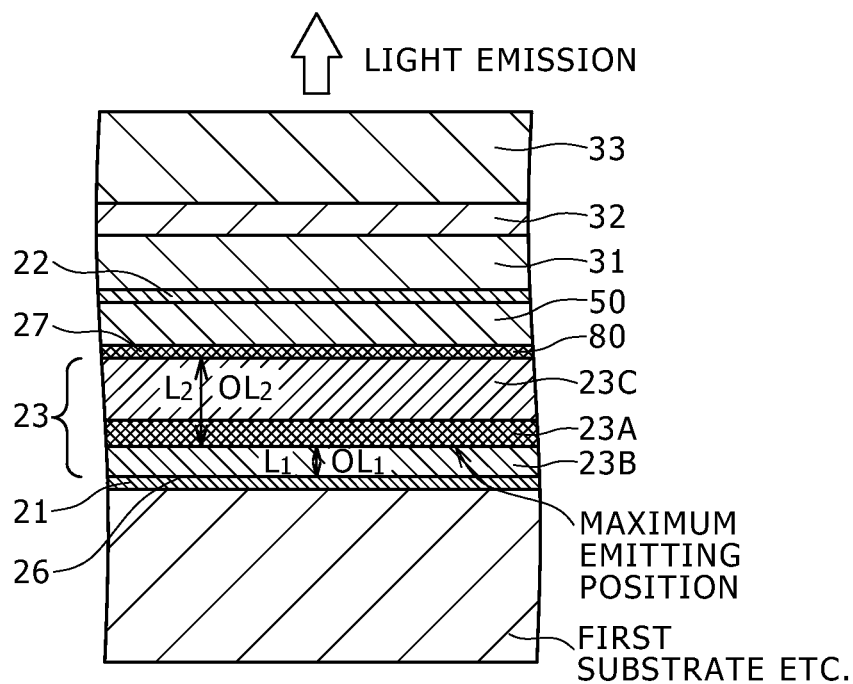

Example 7 is concerned with the light-emitting element pertaining to the second embodiment and the method for production of the light-emitting element according to the embodiment. FIG. 15 is a schematic partly sectional view showing the organic EL display device to which the light-emitting device of Example 7 has been applied. FIGS. 16A and 16B are schematic diagrams showing the organic layer etc. in the light-emitting element of Example 7.

The light-emitting element (organic EL element) of Example 7 is composed of the following components which are sequentially laminated one over another.

(A) first electrode 21,
(B) organic layer 23 having the light-emitting layer 23A made of an organic light-emitting material,
(C) resistance layer 50, and
(D) second electrode 22.

The first electrode 21 reflects light from the light-emitting layer 23A and the second electrode 22 transmits light from the light-emitting layer 23A. The mixture layer 80 including the material constituting the uppermost part of the organic layer 23 and the material constituting the lowermost part of the resistance layer 50, and a metal is formed between the organic layer 23 and the resistance layer 50.

The organic EL display device of Example 7 has a plurality of light-emitting elements (organic electroluminescence elements or organic EL elements) each being composed of the following components which are sequentially laminated one over another.

(a) first electrode 21,
(b) the insulating layer 24 which has the opening 25, at the bottom of which the first electrode 21 exposes itself,
(c) the organic layer 23 which has the light-emitting layer 23A of organic light-emitting material and which extends from that part of the first electrode 21 which exposes itself at the bottom of the opening 25 to that part of the insulating layer 24 which surrounds the opening 25,
(d) the resistance layer 50 covering the organic layer 23, and
(e) the second electrode 22 formed on the resistance layer 50, and each being constructed such that the mixture layer 80 including the material constituting the uppermost part of the organic layer 23 and the material constituting the lowermost part of the resistance layer 50, and a metal is formed between the organic layer 23 and the resistance layer 50.

The first electrode 21 reflects light from the light-emitting layer 23A and the second electrode 22 transmits light from the light-emitting layer 23A.

That part of the mixture layer 80 which is above the insulating layer 24 is at least partly discontinuous.

To be more specific, the mixture layer 80 in Example 7 is composed of ET085 (mentioned above) which constitutes the uppermost part of the organic layer 23, $Nb_2O_5$ which constitutes the lowermost part of the resistance layer 50, and alkaline earth metal (specifically Ca).

Example 7 is identical with Example 1 in the structure of the first electrode 21, the second electrode 22, and the organic layer 23. Example 7 is also identical with Example 1 in that the organic layer 23 and the half-transmitting/reflecting film 40 hold between them an electron injection layer (not shown) of LiF (0.3 nm thick). Moreover, the light-emitting element (organic EL element) and the organic EL display device of Example 7 are substantially identical in structure with those of Example 1 except that the half-transmitting/reflecting film 40 is replaced by the mixture layer 80. Therefore, they will not be explained below in more detail. Incidentally, the mixture layer 80 was found to have the refractive index and light transmittance as shown in Table 13 below.

Table 13
Refractive index of the mixture layer 80
Real part:0.617
Imaginary part:3.904
Light transmittance of the mixture layer 80:60%

Although that part of the mixture layer which is on the insulating layer 24 is at least partly discontinuous, that part of the mixture layer which is on the insulating layer 24 is partly connected to that part of the mixture layer which is on the organic layer 23. In some cases, that part of the mixture layer which is on the insulating layer 24 is not connected to that part of the mixture layer which is on the organic layer 23. In the case of some organic EL elements, that part of the mixture layer which is on the insulating layer 24 is partly connected to that part of the mixture layer which is on the organic layer 23, and in the case of another organic EL elements, that part of the mixture layer which is on the insulating layer 24 is connected to that part of the mixture layer which is on the organic layer 23. Incidentally, that part of the mixture layer which is on the insulating layer 24 is smaller in average film thickness than that part of the mixture layer which is on the organic layer 23. Therefore, that of the mixture layer which is on the insulating layer 24 can be made discontinuous.

Example 7 is designed such that the light emitted from the light-emitting layer 23A is made to resonate between the interface formed by the first electrode 21 and the organic layer 23 and the interface formed by the mixture layer 80 and the organic layer 23, and a portion of the resonated light is made to emerge from the mixture layer 80 and then the second electrode 622.

The light-emitting element of Example 7 is constructed as shown in FIGS. 16A and 16B. The first interface 26 formed by the first electrode 21 and the organic layer 23 is separate from the maximum emitting position of the light-emitting layer 23A over a distance of $L_1$ and an optical distance of $OL_1$. And the second interface 27 formed by the mixture layer 80 and the organic layer 23 is separate from the maximum emitting position of the light-emitting layer 23A over a distance of $L_2$ and an optical distance of $OL_2$. Then, these parameters satisfy the formulas (1-1) and (1-2) below.

$$0.7\{-\Phi_1/(2\Pi)+m_1\} \leq 2 \times OL_1/\lambda \leq 1.2\{-\Phi_1/(2\Pi)+m_1\} \quad (1-1)$$

$$0.7\{-\Phi_2/(2\Pi)+m_2\} \leq 2 \times OL_2/\lambda \leq 1.2\{-\Phi_2/(2\Pi)+m_2\} \quad (1-2)$$

where,
$\lambda$: maximum peak wavelength of spectrum of light generated by the emitting layer 23A,
$\Phi_1$: amount (in radians) of the phase shift of reflected light that occurs at the first interface 26
[where $-2\Pi < \Phi_1 \leq 0$],
$\Phi_2$: amount (in radians) of the phase shift of reflected light that occurs at the second interface 27
[where $-2\Pi < \Phi_2 \leq 0$], and
the value of $(m_1, m_2)$ is $(0, 0)$ in Example 7.

Moreover, the light-emitting element of Example 7 has parameters that satisfy the formula below.

$$-0.3 \leq \{(2 \times OL)/\lambda + \Phi/(2\Pi)\} \leq 0.3$$

where, OL denotes the optical distance between the first interface 26 formed by the first electrode 21 and the organic layer 23 and the second interface 27 formed by the mixture layer 80 and the organic layer 23; $\Phi$ denotes the total amount (in radians) of the phase shift of reflected light that occurs at the first interface 26 and the second interface 27 (where $-2\Pi < \Phi \leq 0$), and $\lambda$ denotes the maximum peak wavelength of the spectrum of the light generated by the light-emitting layer 23A.

The light-emitting element of Example 7 has the mixture layer 80 formed between the organic layer 23 and the resistance layer 50. The mixture layer 80 is composed of the first half-transmitting/reflecting film and the second half-transmitting/reflecting film which are sequentially formed by PVD on the organic layer 23. The mixture layer 80 formed in this manner provides good electrical contact between the resistance layer 50 and the organic layer 23 and also improves injection of carries into the organic layer 23. This reduces the driving voltage and extends the life of the light-emitting element.

The light-emitting element of Example 7 has the mixture layer 80 which is formed by carrying out "Step-150" (which is involved in production of the light-emitting element of Example 1) under the conditions shown in Table 14 below. In other words, the mixture layer 80 is formed by sequentially forming the first and second half-transmitting/reflecting films and the resistance layer by PVD on the organic layer 23. The thus formed mixture layer 80 is composed of the material constituting the uppermost part of the organic layer 23, the material constituting the lowermost part of the resistance layer 50, the material constituting the first half-transmitting/reflecting film, and the material constituting the second half-transmitting/reflecting film, which form a perfect whole.

Table 14

Condition for forming the first half-transmitting/reflecting film by vacuum deposition:
  Al heating temperature: 1000° C.
  Al film forming rate: 0.05 nm/sec
Condition for forming the second half-transmitting/reflecting film by vacuum deposition:
  Mg heating temperature: 280° C.
  Mg film forming rate: 0.05 nm/sec
  Ag heating temperature: 1100° C.
  Ag film forming rate: $0.05 \times \{x/(100+x)\}$ nm/sec
  where, "x" is the concentration (%) of Ag.

The embodiments are merely examples of the light-emitting element and organic EL element, the structure of the organic EL display device, and the materials constituting the light-emitting element, organic EL element, and organic EL display device. They may be changed and modified according to circumstances. The light-emitting element of Example 7 may be produced by first forming the second half-transmitting/reflecting film and then forming the first half-transmitting/reflecting film. In addition, Example 7 may be modified such that the half-transmitting/reflecting film is formed as a single layer (that is, it is formed by codeposition with calcium, magnesium, and silver, or by codeposition with aluminum, magnesium, and silver). Otherwise the mixture layer including the material constituting the uppermost part of the organic layer, the lowermost part of the resistance layer, and a metal may be formed between the organic layer and the resistance layer.

The foregoing embodiments may be modified as mentioned above such that the organic layer is formed for individual sub-pixels. Alternatively, each of the red emitting sub-pixel and green emitting sub-pixel has the organic layer extending thereon that constitutes the blue emitting sub-pixel. In other words, it may be so constructed as to have the organic layer constituting the blue emitting sub-pixel as a common layer over the entire region. In this case, the red emitting sub-pixel has a laminate structure composed of the organic layer emitting red light and the organic layer emitting blue light. It emits red light when current flows across the first electrode and the second electrode. However, this causes the blue emitting energy to move to the red emitting organic layer, which improves the light emitting efficiency of the red emitting organic layer. Similarly, the green emitting sub-pixel has a laminate structure composed of the organic layer emitting green light and the organic layer emitting blue light. It emits green light when current flows across the first electrode and the second electrode; however, this causes the blue emitting energy to move to the green emitting organic layer, which improves the light emitting efficiency of the green emitting organic layer. The common layer on the entire surface of the red emitting organic layer and the green emitting organic layer can be formed without the necessity of forming individually the blue emitting organic layer. For example, this eliminates the necessity of mask to form the light-emitting layer constituting the blue emitting organic layer. This contributes to mass production. Also, for example, the red emitting sub-pixel and the green emitting sub-pixel may have the blue emitting organic layer on the red emitting organic layer and the green emitting organic layer which constitute the red emitting sub-pixel and the green emitting sub-pixel.

Figure 17A:
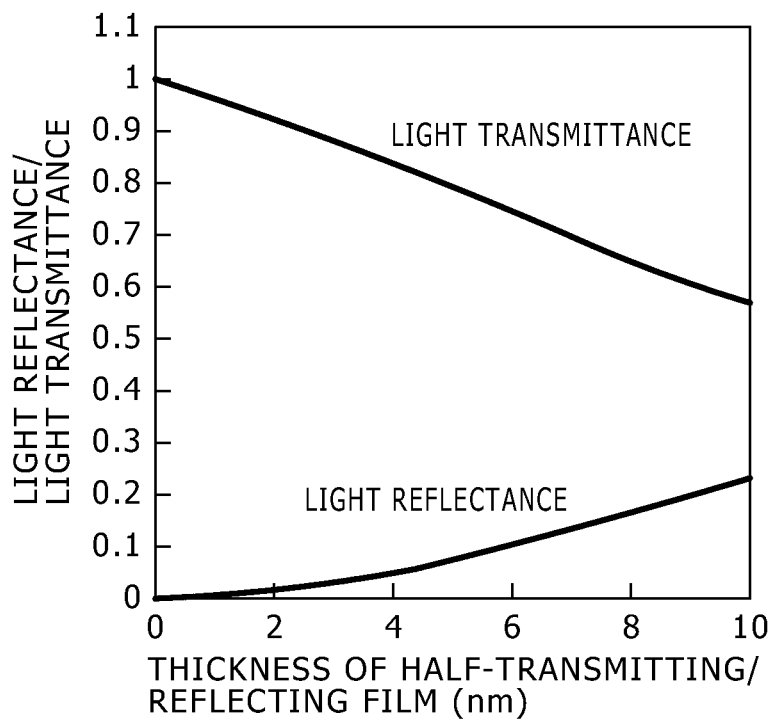
FIGS. 17A and 17B are graphs illustrating respectively the relationship between the thickness of the half-transmitting/reflecting film and the average reflectance and transmittance and the relationship between the difference in refractive index and the average reflectance at the interface of two layers (laminated one over another) differing in refractive index.
Figure 17B:
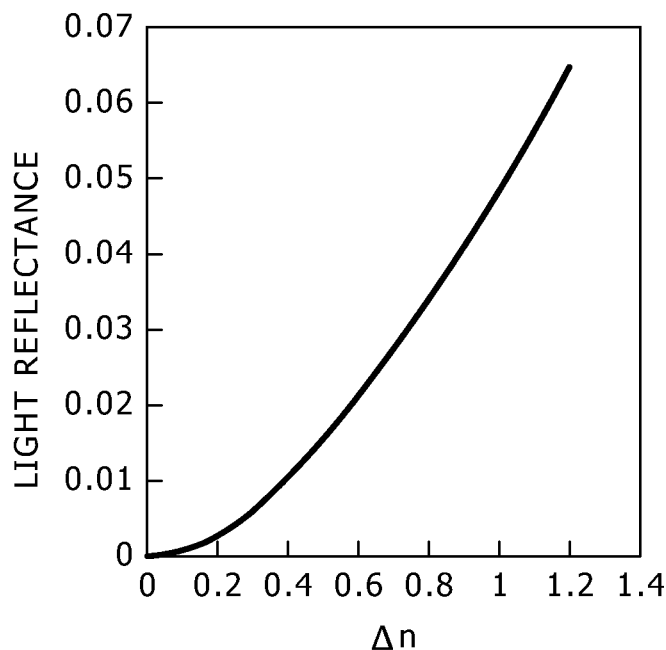
Figure 18:
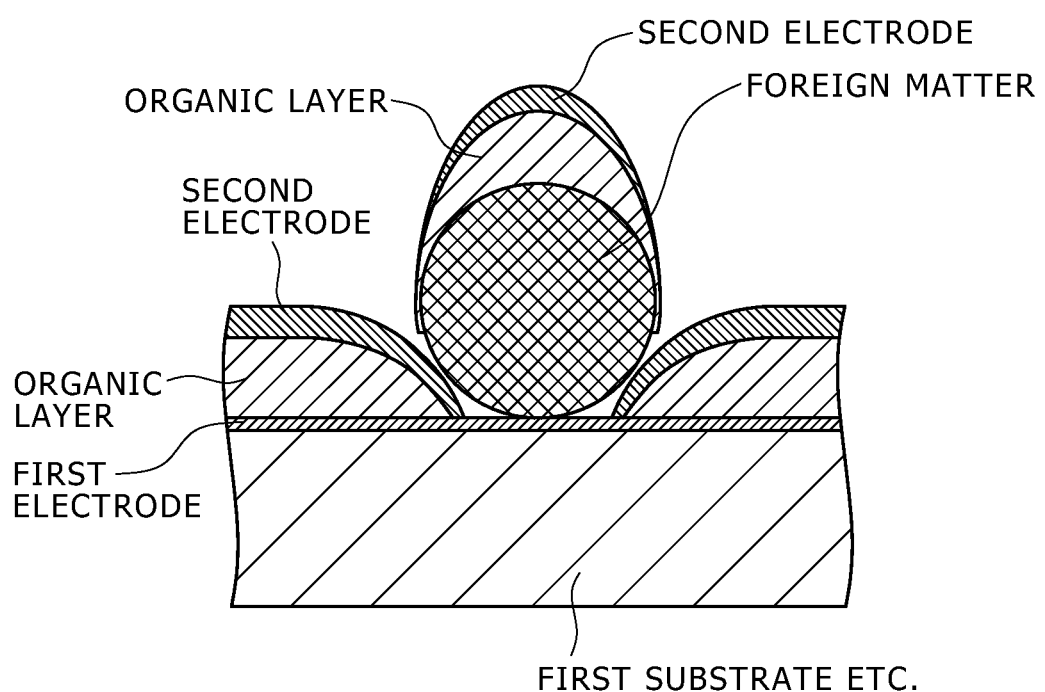
FIG. 18 is a schematic partly sectional view showing the organic layer which is formed in the presence of foreign matter on the first electrode in the related-art organic electroluminescence display device.

FIG. 17A shows the relationship between the thickness of the half-transmitting/reflecting film 40 and the average reflectance and transmittance at a wavelength of 530 nm. It is noted that the average reflectance approaches zero as the half-transmitting/reflecting film 40 decreases in thickness. Thus, the half-transmitting/reflecting film 40 becomes to transmit almost all light as it decreases in thickness. FIG. 17B shows the relationship between the average reflectance of reflection at the interface between layer A and layer B (assuming that light with a wavelength of 530 nm travels from layer A to a layer in contact with layer A) and the difference (Δn) between the refractive index of the material constituting layer A and the refractive index of the material constituting layer B. It is noted that the average reflectance increases owing to Fresnel reflection according as the value of Δn increases.

Therefore, according as the half-transmitting/reflecting film 40 becomes thin and nearly transparent, reflection takes place at the third interface or the interface between the half-transmitting/reflecting film 40 and the resistance layer 50. Alternatively, in the case where the resistance layer 50 is of double-layer structure, reflection takes place mainly at the interface (the fourth interface) between the first resistance layer and the second resistance layer, depending on the material constituting the half-transmitting/reflecting film 40 and the resistance layer of laminate structure. As the result, the light generated by the light-emitting layer is allowed to resonate between the first interface and the third interface (the interface formed by the half-transmitting/reflecting film 40) or between the first interface and the fourth interface (the interface formed by the first resistance layer and the second resistance layer) or between the first interface and the third interface or between the first interface and the fourth interface. The foregoing holds true in the case where the light-emitting element has the mixture layer.

In such cases, therefore, the optical distance $OL_2$ from the second interface to the maximum emitting position of the light-emitting layer should be replaced by the optical distance $OL_2$ from the third interface or the fourth interface to the maximum emitting position of the light-emitting layer. Also, the value of $\Phi_2$ should be replaced by the amount (in radians) of phase shift of the light reflected by the third or fourth interface (provided that $-2\Pi < \Phi_2 \leq 0$). Alternatively, the optical distance OL from the second interface should be replaced by the optical distance OL from the third interface or the fourth interface, and the total amount $\Phi$ (in radians) (provided that $-2\Pi < \Phi \leq 0$) of phase shift that occurs when the light generated by the light-emitting layer is reflected by the first interface and the second interface should be replaced by the total amount 1 (in radians) (provided that $-2\Pi < \Phi \leq 0$) of phase shift that occurs when the light generated by the light-emitting layer is reflected by the first interface and the third interface or the fourth interface. In the case where reflection takes place mainly at the third interface (which is the interface between the half-transmitting/reflecting film 40 and the resistance layer 50), or reflection takes place mainly at the fourth interface (which is the interface between the first resistance layer and the second resistance layer), the phrase reading as "the second interface formed by the half-transmitting/reflecting film and the organic layer" should be changed into the phrase reading as "the third interface which is the interface between the half-transmitting/reflecting film and the resistance layer" or "the fourth interface which is the interface between the first resistance layer and the second resistance layer." This is applicable also to the device having the mixture layer.

The light-emitting element of Example 6 was modified such that the resistance layer is composed of the first resistance layer and the second resistance layer. The modified one is constructed as shown in Table 15 below. It was found that reflection takes place at the third interface (which is the interface between the half-transmitting/reflecting film and the resistance layer) and the fourth interface (which is the interface between the first resistance layer and the second resistance layer). The modified one is 1.3 times as efficient as the light-emitting element in which the resistance layer is composed only of the second resistance layer. Incidentally, there is a relation as defined below among the refractive index $n_1$ of the material constituting the first resistance layer, the refractive index $n_2$ of the material constituting the second resistance layer, and the refractive index $n_0$ of the material constituting the uppermost part of the organic layer.

$-0.6 \leq n_0 - n_1 \leq -0.4$
$0.4 \leq n_1 - n_2 \leq 0.9$

TABLE 15

| | |
|---|---|
| Second substrate | Soda glass |
| Adhesion layer | Acrylic adhesive |
| Protective layer | $SiN_x$ layer (5 μm thick) |
| Second electrode | ITO layer (0.1 μm thick) |
| Second resistance layer | 0.5 μm thick |
| | (refractive index $n_2$: 1.7) |
| First resistance layer | 0.06 μm thick |
| | (refractive index $n_1$: 2.4) |
| Half-transmitting/reflecting film | |
| Second half-transmitting/reflecting film | Mg—Ag film |
| First half-transmitting/reflecting film | Ca film |
| Organic layers (as a whole) | 130 nm thick |
| | (refractive index $n_0$: 1.8) |
| Conductive film | Mg—Ag film (2 nm thick) |
| First electrode | Al—Nd layer (0.2 μm thick) |
| Interlayer insulating layer | $SiO_2$ layer |
| TFT | Constituting the driver for the organic EL element |
| First substrate | Soda glass |

It should be understood that various changes and modifications to the presently preferred embodiments described herein will be apparent to those skilled in the art. Such changes and modifications can be made without departing from the spirit and scope of the present subject matter and without diminishing its intended advantages. It is therefore intended that such changes and modifications be covered by the appended claims.

The invention is claimed as follows:

1. A method for producing a light-emitting element including:
a first electrode,
an organic layer with a light-emitting layer made of organic light-emitting material,
a resistance layer, and
a second electrode,
which are sequentially laminated on top of the other,
the first electrode reflecting light from the light-emitting layer, and
the second electrode transmitting light from the light-emitting layer,
the method comprising:
forming a first half-transmitting/reflecting film and a second half-transmitting/reflecting film sequentially on said organic layer by physical vapor deposition.

2. The method according to claim 1, wherein the first half-transmitting/reflecting film is made of calcium, aluminum, barium, or cesium, and the second half-transmitting/reflecting film is made of magnesium-silver, magnesium-calcium, aluminum, or silver.

3. The method according to claim 1, wherein the resistance layer includes a material having an electrical resistance of $1 \times 10^2$ Ω·m to $1 \times 10^6$ Ω·m, and has a thickness of 0.1 μm to 2 μm.

4. The method according to claim 1, wherein the light emitted from the light-emitting layer is resonated between a first interface and a second interface, the first interface being formed between the first electrode and the organic layer, and the second interface being formed between the half-transmitting/reflecting film and the organic layer, and a part of the resonated light is emitted from the second electrode.

5. The method according to claim 4, which satisfies the formulas (1-1) and (1-2) below:

$$0.7\{-\Phi_1/(2\Pi)+m_1\} \leq 2 \times OL_1/\lambda \leq 1.2\{-\Phi_1/(2\pi)+m_1\} \quad (1\text{-}1)$$

$$0.7\{-\Phi_2/(2\Pi)+m_2\} \leq 2 \times OL_2/\lambda \leq 1.2\{\Phi_2/(2\Pi)+m_2\} \quad (1\text{-}2)$$

where, $OL_1$: an optical distance from the first interface to a maximum emitting position of the light-emitting layer,
$OL_2$: an optical distance from the second interface to a maximum emitting position of the light-emitting layer,
$\lambda$: a maximum peak wavelength of spectrum of light generated by the emitting layer,
$\Phi_1$: an amount in radians of the phase shift of reflected light that occurs at the first interface
[where $-2\Pi < \Phi_1 < 0$],
$\Phi_2$: an amount in radians of the phase shift of reflected light that occurs at the second interface
[where $-2\Pi < \Phi_2 \leq 0$], and
the value of $(m_1, m_2)$ is $(0, 0)$, $(1, 0)$, or $(0, 1)$.

6. The method according to claim 4, which satisfies the formula below:

$$0.7 \leq \{(2 \times OL)/\lambda + \Phi/(2\Pi)\} \leq 1.3$$

or $$-0.3 \leq \{(2 \times OL)/\lambda + \Phi/(2\Pi)\} \leq 0.3$$

where,

OL: an optical distance between the first interface and the second interface,
$\Phi$: a total amount in radians of the phase shift that occurs when the light generated by the light-emitting layer is reflected by the first interface and the second interface (provided that $-2\Pi < \Phi_2 \leq 0$)
$\lambda$: a maximum peak wavelength of spectrum of light generated by the light-emitting layer.

7. The method according to claim 1,
wherein a mixture layer including a material constituting the uppermost layer of the organic layer, a material constituting the lowermost layer of the resistance layer, and a metal is formed between the organic layer and the resistance layer.

8. The method according to claim 7, wherein the metal includes an alkaline earth metal.

9. The method according to claim 7, wherein the resistance layer includes a material having an electrical resistance of $1 \times 10^2$ Ω·m to $1 \times 10^6$ Ω·m, and has a thickness of 0.1 μm to 2 μm.

10. The method according to claim 7, wherein the light emitted from the light-emitting layer is resonated between a first interface and a second interface, the first interface being formed between the first electrode and the organic layer, and the second interface being formed between the resistance layer and the mixture layer, and a part of the resonated light is emitted from the second electrode.

11. The method according to claim 10, which satisfies the formulas (1-1) and (1-2) below:

$$0.7\{-\Phi_1/(2\Pi)+m_1\} \leq 2 \times OL_1/\lambda \leq 1.2\{-\Phi_1/(2\Pi)+m_1\} \quad (1\text{-}1)$$

$$0.7\{-\Phi_2/(2\Pi)+m_2\} \leqq 2 \times OL_2/\lambda \leqq 1.2\{-\Phi_2/(2\Pi)+m_2\} \quad (1\text{-}2)$$

where, $OL_1$: an optical distance from the first interface to a maximum emitting position of the light-emitting layer, $OL_2$: an optical distance from the second interface to the maximum emitting position of the light-emitting layer, $\lambda$: a maximum peak wavelength of spectrum of light generated by the emitting layer, $\Phi_1$: an amount in radians of the phase shift of reflected light that occurs at the first interface [where $-2\Pi < \Phi_1 \leqq 0$], $\Phi_2$: an amount in radians of the phase shift of reflected light that occurs at the second interface [where $-2\Pi < \Phi_2 \leqq 0$], and the value of $(m_1, m_2)$ is $(0, 0)$, $(1, 0)$, or $(0, 1)$.

12. The method according to claim 10, which satisfies the formula below:

$$0.7 \leqq \{(2 \times OL)/\lambda + \Phi/(2\Pi)\} \leqq 1.3$$

or $$-0.3 \leqq \{(2 \times OL)/\lambda + \Phi/(2\Pi)\} \leqq 0.3$$

where, $OL$: an optical distance between the first interface and the second interface, $\Phi$: a total amount in radians of the phase shift that occurs when the light generated by the light-emitting layer is reflected by the first interface and the second interface (provided that $-2\Pi < \Phi \leqq 0$)

$\lambda$: a maximum peak wavelength of spectrum of light generated by the light-emitting layer.

* * * * *